US006304199B1

(12) United States Patent
Fang et al.

(10) Patent No.: US 6,304,199 B1
(45) Date of Patent: Oct. 16, 2001

(54) METHOD AND APPARATUS FOR DEGLITCHING DIGITAL TO ANALOG CONVERTERS

(75) Inventors: Gary G. Fang, San Jose; David Castaneda, Sunnyvale; Chowdhury F. Rahim, Saratoga, all of CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/305,909

(22) Filed: May 5, 1999

(51) Int. Cl.[7] .................................................... H03M 1/06
(52) U.S. Cl. ............................................ 341/118; 341/144
(58) Field of Search .................................... 341/118, 120, 341/144

(56) References Cited

U.S. PATENT DOCUMENTS

| | | | | |
|---|---|---|---|---|
| 4,584,559 | * | 4/1986 | Penney | 340/347 |
| 5,034,744 | * | 7/1991 | Obinata | 341/118 |
| 5,614,903 | * | 3/1997 | Oyama | 341/118 |
| 5,646,620 | * | 7/1997 | Regier | 341/118 |
| 6,075,473 | * | 6/2000 | Masuda | 341/118 |

FOREIGN PATENT DOCUMENTS 0 061 199 A2   9/1982   (EP) .............. H03K/13/05
WO 89/08953    9/1989   (WO) ............. H03M/1/06

OTHER PUBLICATIONS

Richard C. Dorf, The Electrical Engineering Handbook, 1993, pp. 771–775, 781–782, CRC Press, Inc., Boca Raton.
Alan B. Grebene, Bipolar and Mos Analog Integrated Circuit Design, 1984, pp. 303–308, 753–755, 770–771, John Wiley & Sons, New York.
David C. Pinkowitz, Deglitched DACs improve vector-–stroke displays, Apr. 18, 1985, pp. 239–242, Electrical Design News, Cahners Publishing Co. Newton, Massachusetts, USA.

* cited by examiner

Primary Examiner—Peguy Jeanpierre
(74) Attorney, Agent, or Firm—Blakely, Sokoloff, Taylor & Zafman LLP

(57) ABSTRACT

Asynchronous and synchronous deglitch controllers controlling switches of sample and hold circuits for deglitching digital to analog converters. Asynchronous and synchronous deglitch controllers detect transitions in the state of the digital input code to trigger or allow a one shot pulse to cause sample and hold circuits to go into hold mode for the period of the one shot pulse. Secondary glitch cancellation circuitry models the environment of the sample and hold circuit to emulate secondary glitch impulse generation. A differential amplifier substantially cancels secondary glitches related to the parasitic charges generated by the switching of the sample and hold circuit.

95 Claims, 15 Drawing Sheets

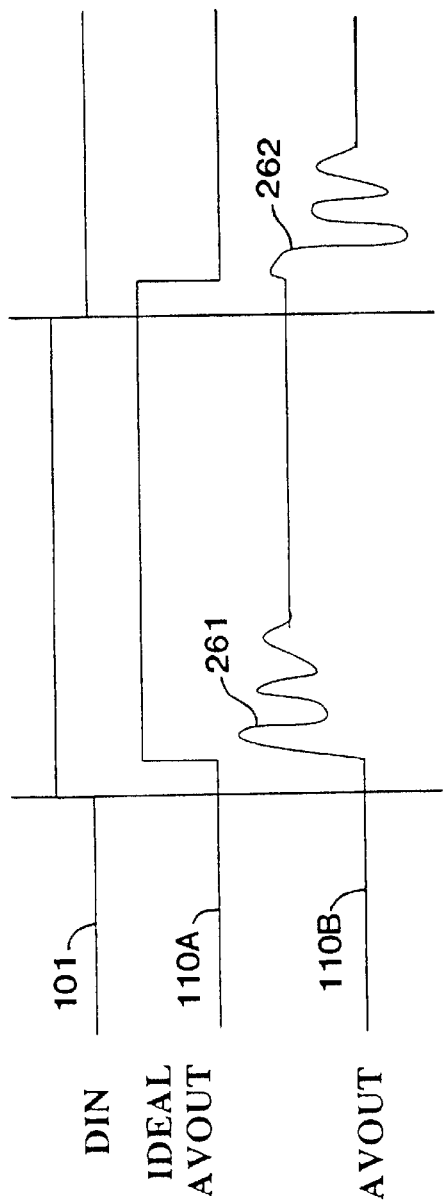
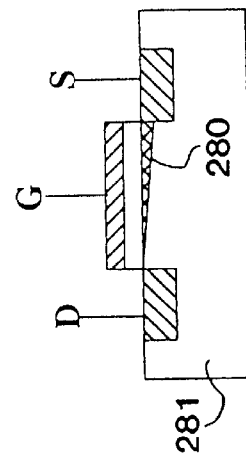
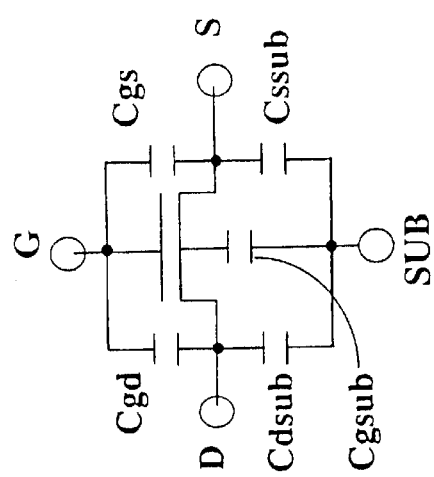
FIG. 2B (Prior Art)
FIG. 2E (Prior Art)
FIG. 2C (Prior Art)

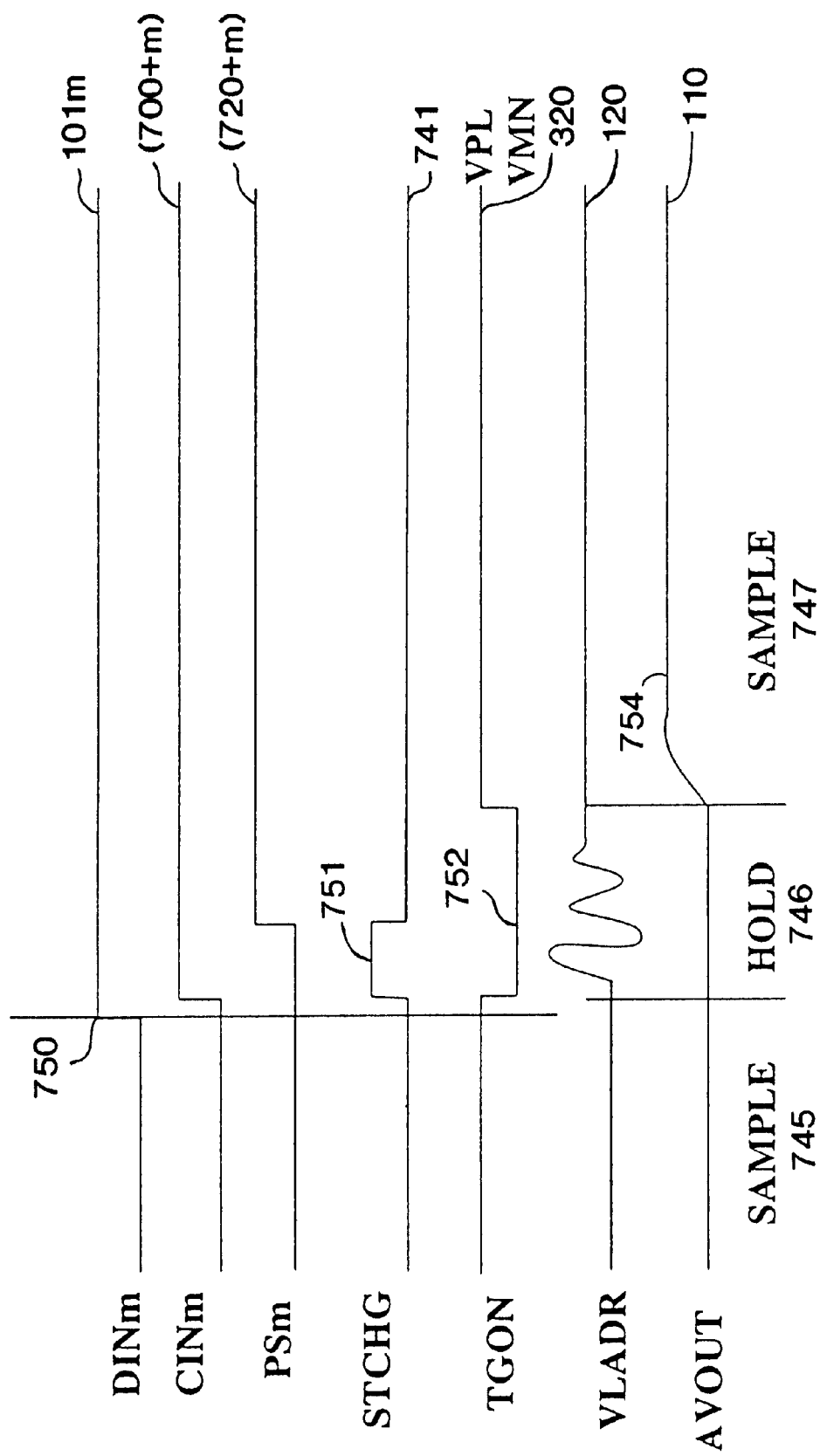

METHOD AND APPARATUS FOR DEGLITCHING DIGITAL TO ANALOG CONVERTERS

CROSS REFERENCE TO RELATED APPLICATION

This application is related to U.S. patent application Ser. No. 09/305,909, filed May 5, 1999 by inventors FANG et al, entitled "METHOD AND APPARATUS FOR SWITCHING LOW VOLTAGE CMOS SWITCHES IN HIGH VOLTAGE DIGITAL TO ANALOG CONVERTERS" and to be assigned to Maxim Integrated Products, Inc. the disclosure of which is hereby incorporated by reference, verbatim and with the same effect as though it were fully and completely set forth herein.

This application is also related to U.S. patent application Ser. No. 09/299,691, filed Apr. 26, 1999 by inventors CASTENEDA et al, entitled "METHOD AND APPARATUS FOR DIGITAL TO ANALOG CONVERTERS WITH IMPROVED SWITCHED R-2R LADDERS" and assigned to Maxim Integrated Products, Inc. the disclosure of which is hereby incorporated by reference, verbatim and with the same effect as though it were fully and completely set forth herein.

FIELD OF THE INVENTION

This invention relates generally to digital to analog converters. More particularly, the invention relates to a digital to analog converter output stages.

BACKGROUND OF THE INVENTION

The functional operation of a digital to analog converter (DAC) is well known. Generally, a DAC accepts an digital input signal and converts it into an analog output signal. The digital input signal has a range of digital codes which are converted into a continuous range of analog signal levels of the analog output signal. DACs are useful to interface digital systems to analog systems. Applications of DACs include video or graphic display drivers, audio systems, digital signal processing systems, function generators, digital attenuators, precision instruments and data acquisition systems including automated test equipment.

There are a variety of DACs available for converting digital input signals into analog output signals depending upon the desired conversion functionality. The variations in the DACs available may have different predetermined resolutions of a digital input signal, have different ranges of analog output signals using a fixed reference or a multiplied reference, and provide different types of analog output signals. Additionally there are a number of DAC performance factors to consider such as settling time, full scale transition time, accuracy or linearity, and a factor previously mentioned, resolution.

The digital input signal is a number of bits wide which defines the resolution, the number of output levels or quantization levels and the total number of digital codes that are acceptable. If the digital input signal is m-bits wide, there are $2^m$ output levels and $2^{m-1}$ steps between levels. The range of analog output signal values usually depend upon an analog reference. The analog reference may be internally generated but is usually externally provided for precision. The analog output signal range may be proportional to the digital input signal over a fixed analog reference level as in a fixed reference DAC. Alternatively, the analog output signal may be the product of a varying input analog reference level and the digital code of the digital input signal as in multiplying DACs. The analog output signal may be unipolar ranging in either positive values or negative values or it may be bipolar ranging between both positive and negative output values. The analog output signal may be an analog voltage signal or an analog current signal.

Additionally, the type of electronic circuitry used to form a DAC varies as well. Bipolar junction transistor (BJT) technology, metal oxide semiconductor (MOS) technology or a combination thereof are used to construct DACs. BJT technology may be PNP technology with PNP transistors or NPN with NPN transistors or both, while MOS technology may be PMOS with P-channel field effect transistors (PFET), NMOS with N-channel field effect transistors (PFET) or CMOS technology having both PFETs and NFETs.

Referring now to FIG. 1A, a block diagram of a DAC 100 has a digital input signal DIN 101, a positive analog supply voltage level AVref+104, and a negative analog supply voltage level AVref-105 in order to generate an analog voltage output signal on the DAC output terminal AVOUT 110. Alternatively DAC 100 can generate an analog current output signal with minor changes to its circuit configuration. For simplicity in discussion, consider DAC 100 to be a fixed reference DAC such that the output voltage range of AVOUT 110 is a function of DIN 101 and the range of voltage is defined by the predetermined voltage levels of AVref+104 and AVref-105. DIN 101 is m bit wide. The predetermined value of m is the resolution of the DAC. The selected circuitry for DAC 100 varies depending upon a number of factors including power supply range and desired parameters of input and output signals. As illustrated in FIG. 1B, DAC 100 includes a signal converter 112 coupled to an amplifier or buffer 114. Some forms of DACs, specifically current output DACs, may not include the buffer 114 and require external amplification. Signal converter 112 converts DIN 101 into a form of analog signal on the intermediate signal line VLADR 120 which is input to buffer 114. Buffer 114 buffers the analog signal generated by the signal converter 112 from a load that may be coupled to the DAC output terminal AVOUT 110. The signal converter 112 includes a switched R-2R ladder 116 and a switch controller 118. Switch controller 118 controls switches within the switched R-2R ladder 116 to cause it to convert the value of DIN 101 into an analog signal.

Referring now to FIG. 2A, a prior art switched R-2R ladder 116 is illustrated. The switched R-2R ladder 116 is a 4 bit inverted R-2R ladder to provide an analog voltage output signal but may be easily expanded to m-bits with the addition of other intermediate R-2R switch legs and additional switch control lines. Alternatively, a non-inverted R-2R ladder could be used to provide an analog current output signal. Signals DBn/DBp 201 are selectively controlled by the switch controller 118 in order to generate an analog voltage output signal VLADR 120. DBn/DBp 201 switches ON and OFF NFETS 211–214 and PFETS 216–219 in order to change the voltage division of the R-2R resistor network between AVref+104 and AVref-105 and VLADR 120. Inverters 246–249 generate the inverter polarity of the switch control lines D4Bp-D1Bp 241–244 to control the NFETs 236–239 to form fully complementary switches with PFETs 216–219. NFET 211 and PFET 216/NFET 236 represent the MSB of the DAC and can couple 8/16 of the reference voltage range to VLADR 120. NFET 212 and PFET 217/NFET 237 can couple 4/16 of the reference voltage range to VLADR 120. NFET 213 and PFET 218/NFET 238 can couple 2/16 of the reference voltage range to VLADR 120. NFET 214 and PFET 219/NFET 239 represent the LSB of the DAC and can couple 1/16 of the reference voltage range to VLADR 120. Thus, when the digital code is 1111, PFETs 216–219 and NFETs 236–239 are all ON and NFETS 211–214 are all OFF such that 15/16 of the reference voltage range is coupled to VLADR 120. When the digital code is 0000, NFETS 211–214 are all ON and PFETs 216–219 and NFETs 236–239 are all OFF such that no current flows between AVref+104 and AVref−105 in a resistor and AVref−105 is coupled to VLADR 120.

The circuit connections of the switched R-2R ladder 116 are now described. NFET 215 has its gate tied to terminal leg gate voltage signal, TLGV 235, such that it is constantly turned ON. The voltage level of TLGV 235 is the same as the turn ON voltage level for all the NFETs 211–214 switching AVref−in the switched R-2R ladder 116. NFETS 211–215 have sources connected to AVref−105 and drains respectively connected to first ends of resistors 220–223. PFETS 216–219 have sources connected to AVref+104 and drains respectively connected to first ends of resistors 220–224. NFETs 236–239 have sources respectively connected to the first ends of resistors 220–223 and drains connected to AVref+104. The gates of NFETS 211–214 are respectively connected to signals D4Bn-D1Bn 231–234 and gates of PFETS 216–219 are respectively connected to signals D4Bp-D1Bp 241–244 of DBn/DBp 201. The inverters 246–249 have inputs respectively coupled to signals D4Bp-D1Bp 241–244 to generate the inverted polarity for coupling their outputs to the gates of NFETs 236–239 respectively. Signals D4Bn-D1Bn 231–234 and signals D4Bp-D1Bp 241–244 are collectively referred to as signals DBn/DBp 201 from switch controller 118. Resistors 220–223 each have a resistance value of 2R. Resistors 224–228 each having a resistance value of R are coupled in series together with a first end of resistor 228 coupled to VLADR 120. A second end of resistor 224 is coupled to a second end of resistor 225 at node 250 while a second end of resistor 220 is coupled to VLADR 120. Resistors 223, 225, and 226 each have an end coupled to node 251. Resistors 222, 226, and 227 each have an end coupled to node 252. Resistors 221, 227, and 228 each have an end coupled to node 253. The MSB leg of the switched R-2R ladder 116 is defined as NFET 211/PFET 216/NFET 236 and resistor 220, the LSB leg as NFET 214/PFET 219/NFET 239 and resistors 223 and 226, and the termination leg as NFET 215 and resistors 224–225. The intermediate legs of the switched R-2R ladder 116 are NFET 213/PFET 218/NFET 238 and resistors 222 and 227 and NFET 212/PFET 217/NFET 237 and resistors 221 and 228.

PFETS and NFETS are scaled because of the binary weighting from LSB to MSB. For example, if NFET 214/PFET 219/NFET 239 switches are weighted 1×, NFET 213/PFET 218/NFET 238 switches are weighted 2×, NFET 212/PFET 217/NFET 237 switches are weighted 8×, and NFET 211/PFET 216/NFET 236 switches are weighted 16× in transistor size to reduce the RON of the transistors. This reduces user trimming for a drift that would otherwise be introduced by mismatched RON resistances when the transistor switches are turned ON and OFF. NFET 215 is provided in the termination leg to match RON of the MSB switch (NFET 214). Preferably, NFETS 211–215, PFETS 216–219, and NFETs 236–239 operate in their linear region to maintain linearity of the DAC.

As previously discussed, there are a number of DAC performance factors to consider including certain DAC speed factors such as settling time and full scale transition time. Full scale transition time is the time required for a DAC output to swing during a transition from a zero digital input to a full scale digital input from 10% to 90% of the output voltage value or a transition from a full scale digital input to a zero digital input from 90% to 10% of the output voltage value. Settling time is the time required for a DAC output voltage on AVOUT 110 to settle to within the error value, such as one half of the LSB value, of the desired output voltage value during a full scale transition. There is a positive settling time for a full scale transition from zero digital input to a full scale digital input and a negative settling time for a full scale transition from a full scale digital input to a zero digital input.

Other performance factors to consider associated with a digital to analog converter is glitch impulses and their associated glitch amplitude on AVOUT 110. Primary glitch impulses and their associated amplitudes are related to the switching ON and OFF of NFETS 211–214 and PFETS 216–219 of the R-2R ladder 116 in order to change the R-2R resistor network between AVref+104 and AVref−105 and VLADR 120 to generate an analog voltage level on VLADR 120 a function of DIN 101. FIG. 2B is a timing diagram illustrating the glitch impulses and their associated amplitudes. When DIN 101 switches to change state, an idealized DAC would immediately respond by transitioning to the new analog level after some time delay. The idealized AVOUT waveform 110A illustrates the immediate transition to a new analog level. In actuality, glitch impulses 261–262 are generated in prior art DACs which cause additional ringing in AVOUT 110 before settling to the proper analog level.

Primary glitch impulses are ordinarily known to be associated with the major carry transitions of the DAC. This is where the input code changes to cause the MSB to change state as compared with the other order bits of DIN 101. For example, a major carry transition occurs when the leg of the R-2R ladder 116 is caused to turn ON while the lower order bits are turned OFF. However, additional lower amplitude primary glitch impulses occur as a result of the gates of the NFETS and PFETS in the R-2R ladder changing state.

Each of the NFET 211–214 and PFET 216–219 switches have parasitic capacitances associated with them. FIG. 2C illustrates the typical parasitic capacitances associated with a MOSFET such as an NFET or PFET. The gate to source capacitance Cgs, gate to drain capacitance Cgd, and gate to substrate or body capacitance Cgsub contribute most greatly to the glitch impulses and the lower order amplitudes. As the gate of the NFET 211–214 and PFET 216–219 switches of the R-2R ladder 116 change state, the parasitic capacitance of Cgsub, Cgs and Cgd cause charge sharing, also referred to as clock feedthrough, to occur with the capacitance in the R-2R ladder and on VLADR 120. If the NFET/PFET pairs of the NFET 211–214 and PFET 216–219/NFET 236–239 switches could switch simultaneously, gates of the PFET/NFET pairs changing to an opposite state of the NFETS, the charge sharing and would mostly be canceled and any glitch would be relatively small. However, the NFET/PFET pairs of the NFET 211–214 and PFET 216–219 switches can not switch simultaneously because to do so would result in crowbar currents between power supplies. Thus, switch controller 118 provides for break before make timing of switching the NFET 211–214 and PFET 216–219 switches generating a timing slew between NFET switch control signals driving the NFETS and PFET/NFET switch control signals driving the gates of the PFETS/NFETS of the PFET/NFET pairs. Because of the timing slew between NFET switch control signals and PFET/NFET switch control signals, charge cancellation does not occur and charges get coupled to the R-2R ladder and its output VLADR 120. Charges coupled into capacitors and resistors cause voltage spikes. These voltage spikes, referred to as glitch impulses. Charges coupled onto VLADR 120 cause voltage spikes or glitch impulses which are then coupled into the buffer 114 and driven out onto AVOUT 110 as amplified glitch impulses.

The problem of glitch impulses associated with the NFET 211–214 and PFET 216–219/NFET 236–239 switches of the R-2R ladder is exacerbated when it is desirable to design DACs with increased resolution. This is because more PFET and NFET switches in the switched R-2R ladder 116 and more digital lines DBn/DBp 201 are changing state to provide greater resolution. Additionally, the amplitude of glitch impulses is increased when it is desired to provide a higher voltage range between AVref+104 and AVref−105 because of larger voltage swings during the major carry transitions of the DAC.

Prior art methods of controlling the glitch impulses include adding a large capacitor to the output VLADR 120 of R-2R ladder 116. The combination of the resistance in the R-2R ladder 116 and the large capacitor act as a low pass filter reducing the amplitude of the glitches before reaching the input of the buffer 114. However, to significantly reduce the amplitude of the glitches, the capacitor coupled to VLADR 120 must be sufficiently large which causes the settling times of the DAC to significantly increase. Increases in settling time of a DAC are undesirable.

Another prior art method of controlling the glitch impulses, without increasing the transition time and settling time, is to provide a sample and hold circuit at the output AVout 110 of DAC 100 which is disclosed in "Bipolar and MOS Analog Integrated Circuit Design" by Alan B. Grebene 1984 (pages 754 and 770). Referring to FIG. 2D, a sample and hold circuit 270 is illustrated coupled to the output AVOUT 110 of DAC 100. The sample and hold circuit 270 includes a track and hold switch T/H SW 272, a capacitor 274, and a buffer or amplifier 276. It was thought that by sampling the output AVOUT 110 of the DAC 100 after conversion is completed and the glitch impulses 261–262 have settled out, the output of the sample and hold SAHout 277 may be free from glitches. This may be the case with idealized circuitry, however, the track and hold switch T/H SW 272 is usually implemented by using an NFET, PFET or both NFET and PFET switches in parallel which when switched generates parasitic charges.

Referring now to FIG. 2E, a cross section of a MOSFET provided as the T/H SW 272 is illustrated with voltages being applied to its terminals. The voltages applied across the drain to source, gate to source, and gate to substrate terminals cause a channel charge 280 to be induced in the substrate or body 281 of the transistor when the gate is switched ON. This channel charge 280 needs to be dissipated when the gate of the track and hold switched T/H SW 272 is switched OFF. When switched ON, the channel charge 280 needs to be induced. When the gate of the MOSFET changes state to turn OFF T/H SW 272, the channel charge 280 is released from the channel into the MOSFET's source and drain. When the gate changes state to turn the T/H SW 272 ON, the channel charge 280 is supplied from the source and drain into the channel. This phenomenon is referred to as charge injection. Charge injection couples charges into the capacitance of the sample and hold circuit 270, including the capacitor 274, such that rather large voltage spikes or secondary glitch impulses are generated due to the switching of the track and hold switch T/H SW 272. From the parasitic capacitance associated with FIG. 2C, clock feedthrough also occurs when switching of the track and hold switch T/H SW 272. Thus, by simply providing a sample and hold circuit 270 at the output of DAC 100, charges may still be coupled into the sample and hold circuit 270 and cause secondary glitch impulses at the output SAHout 277. Thus, it is desirable to provide additional circuitry around the sample and hold circuit 270 such that charges coupled thereto are reduced and the secondary glitch impulses substantially eliminated. However, even charge cancellation circuitry can introduce low amplitude glitches during sample and hold transitions into the output of a sample and hold circuit 270. It is desirable to additionally provide another means for avoiding such low amplitude glitches.

Usually the track and hold switch T/H SW 272 is controlled by a clock signal that drives the gate of a PFET and/or NFET switch periodically. The periodic switching of the PFET and/or NFET couples charges into the hold capacitor of the sample and hold circuitry introducing glitch impulses of its own. However, it is not always the case that the track and hold switch T/H SW 272 needs to be periodically driven by a clock signal to cycle back and forth between sample and hold periods. For example, if the digital input signal DIN 101 does not change state, there is no transition in the DAC 100 and switches in the switched R-2R ladder 116 are not transitioned between ON and OFF states. Thus, no glitch impulse occurs because there is no change in DIN 101 and the output VLADR 120 of the R-2R ladder 116 is stable. To switch the sample and hold circuit 270 during this condition, unnecessarily injects charges into the sample and hold and produces the secondary glitch impulses. Thus, it is desirable to further control the track and hold switch T/H SW 272 of a sample and hold circuit 270 such that secondary glitch impulses at the output of a DAC 100 are further reduced.

BRIEF SUMMARY OF THE INVENTION

Briefly, the present invention includes a method, apparatus and system for deglitching digital to analog converters as described in the claims. Improved digital to analog converters (DACs) are disclosed to reduce glitch impulses associated with switch transitions. An asynchronous deglitch controller for DACs, detects transitions in the digital input code triggering a one shot. The one shot causes a sample and hold circuit to switch to the hold mode if transitions in the digital input code occur. If no transitions in the digital input are detected, the sample and hold circuit remains in the sample mode. The period of the one shot is set to allow an R-2R ladder of the DAC to mask out the primary glitch impulses. After the period of the one shot expires, the sample and hold circuit is switched back to the sample mode. Detecting transitions of the digital input in this manner, reduces switching the sample and hold circuit and therefor reduces the number of secondary glitch impulses generated by sample and hold switches.

In a synchronous deglitch controller for DACs, a load pulse, synchronous with the digital input code, triggers a one shot when a new digital input code is to be input into the DAC. The one shot generates a one shot pulse. The one shot pulse is gated by detection circuitry that detects transitions in the digital input code. If the detection circuitry detects that the new digital input code is different from the prior digital input code, the one shot pulse is allowed to cause sample and hold circuitry to switch to a hold mode. The period of the one shot is set to allow an R-2R ladder of the DAC to settle to mask out the primary glitch impulses. After the period of the one shot expires, the sample and hold circuit is switched back to the sample mode. However, if the new digital input code is the same as the prior digital input code, the detection circuitry inhibits the one shot pulse from switching the sample and hold circuit from a sample mode to a hold mode. Detecting transitions in this manner reduces switching the sample and hold circuit and therefor reduces the number of secondary glitch impulses generated by the sample and hold switch.

Improved glitch cancellation circuitry is used to further reduce secondary glitch impulses. The glitch cancellation circuitry models the sample and hold circuitry, including the switches and the hold capacitor, and the input resistance of the switched R-2R ladder. The emulated secondary glitches generated by the secondary glitch cancellation circuitry are input to the negative terminal of a differential amplifier. The output from the sample and hold circuit, representing the analog voltage level generated by the switched R-2R ladder, is input to the positive terminal of the differential amp. When transitions in the sampling switch occur, they are emulated by the secondary glitch cancellation circuitry to model secondary glitches generated by the parasitics of the switch. With similar effects occurring at negative and positive terminals of the differential amp during switching, the differential amp output rejects the change due to the equivalent secondary glitches provided at each terminal from the switches.

Additionally, a variable gain of N greater than one is provided in another embodiment of the present invention. This allows for low voltage CMOS transistors, having a breakdown voltage less than the analog output range and power supply range, to be used as the track and hold (T/H) switches of a sample and hold circuit. The variable gain of N provides a wider analog output range than the voltage range generated by the switched R-2R ladder. The feedback network provides pole-zero cancellation for stability. The resistors of the feedback network are chosen to match the output resistance of the DAC in order to provide base current cancellation to reduce/eliminate input referred voltage offset of a differential amplifier. Additionally, the feedback network provides charge emulation/cancellation to reduce secondary glitches from the T/H switches. The gain of N is selectable and equations are disclosed for resistance and capacitance values of the feedback network.

A level shifter is provided in the preferred embodiments translating the deglitch control signal to logical voltage levels that avoid switch breakdown when a power supply range exceeds the switch breakdown voltage. A positive generated voltage and a negative generated voltage are formed such that the difference between them is less than the switch breakdown voltage. This allows for PFET and NFET switches which have a breakdown voltage less than the power supply range to be used as the T/H switch.

BRIEF DESCRIPTIONS OF THE DRAWINGS

FIG. 2B is a prior art timing diagram of the input and output signals of the digital to analog converter of FIG. 1.

FIG. 2C is a prior art schematic diagram of a field effect transistor including its parasitic capacitances.

FIG. 2E is a prior art cross sectional diagram of a field effect transistor having channel charges induced into its channel.

FIG. 7B is a timing diagram of signals generated by asynchronous deglitch controller of FIG. 7A for the deglitch circuitry of the present invention.

Like reference numbers and designations in the drawings indicate like elements providing similar functionality.

DETAILED DESCRIPTION OF THE PREFERRED EMBODIMENT

Figure 1:
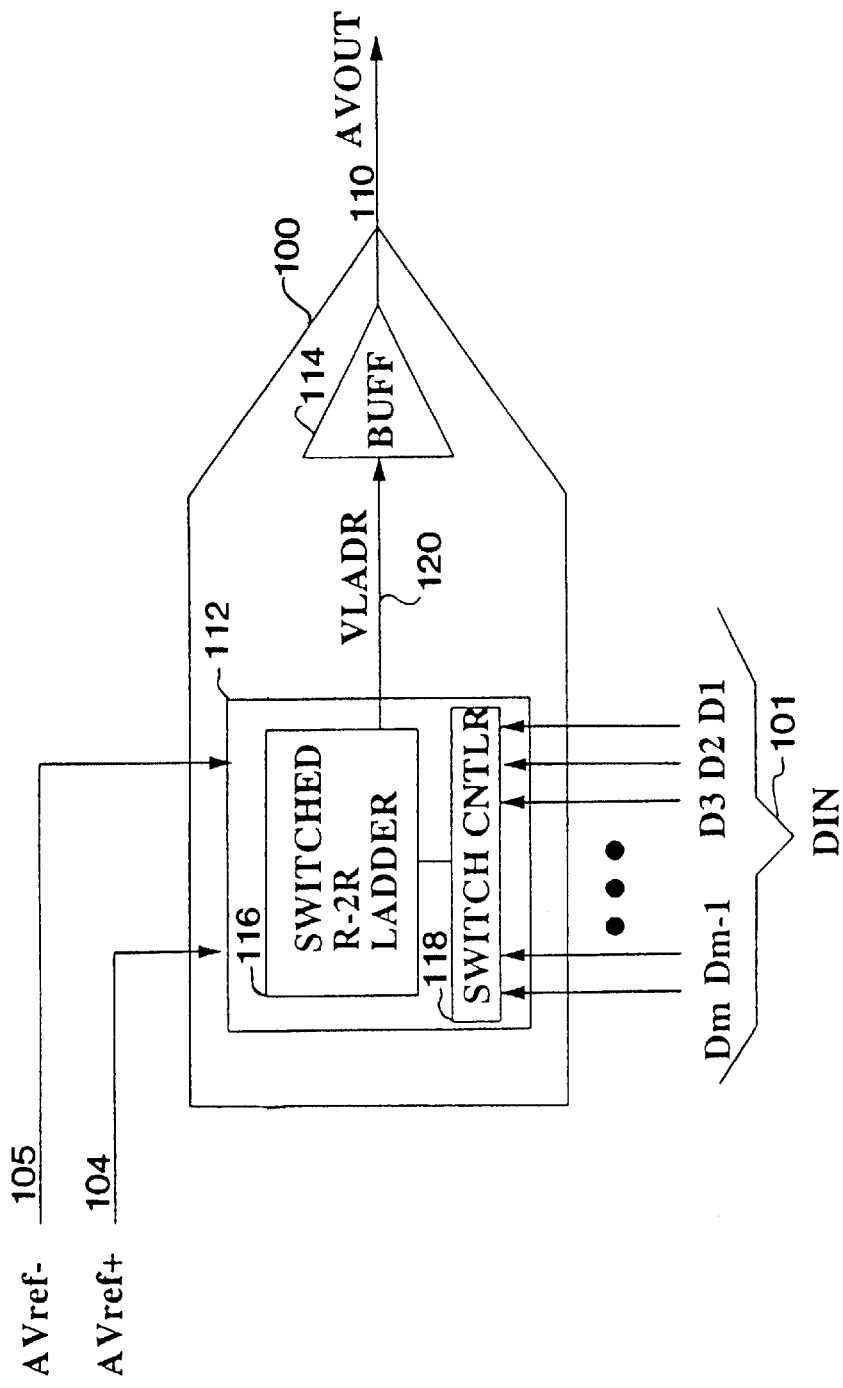
FIG. 1 is a prior art block diagram of a digital to analog converter.
Figure 2A:
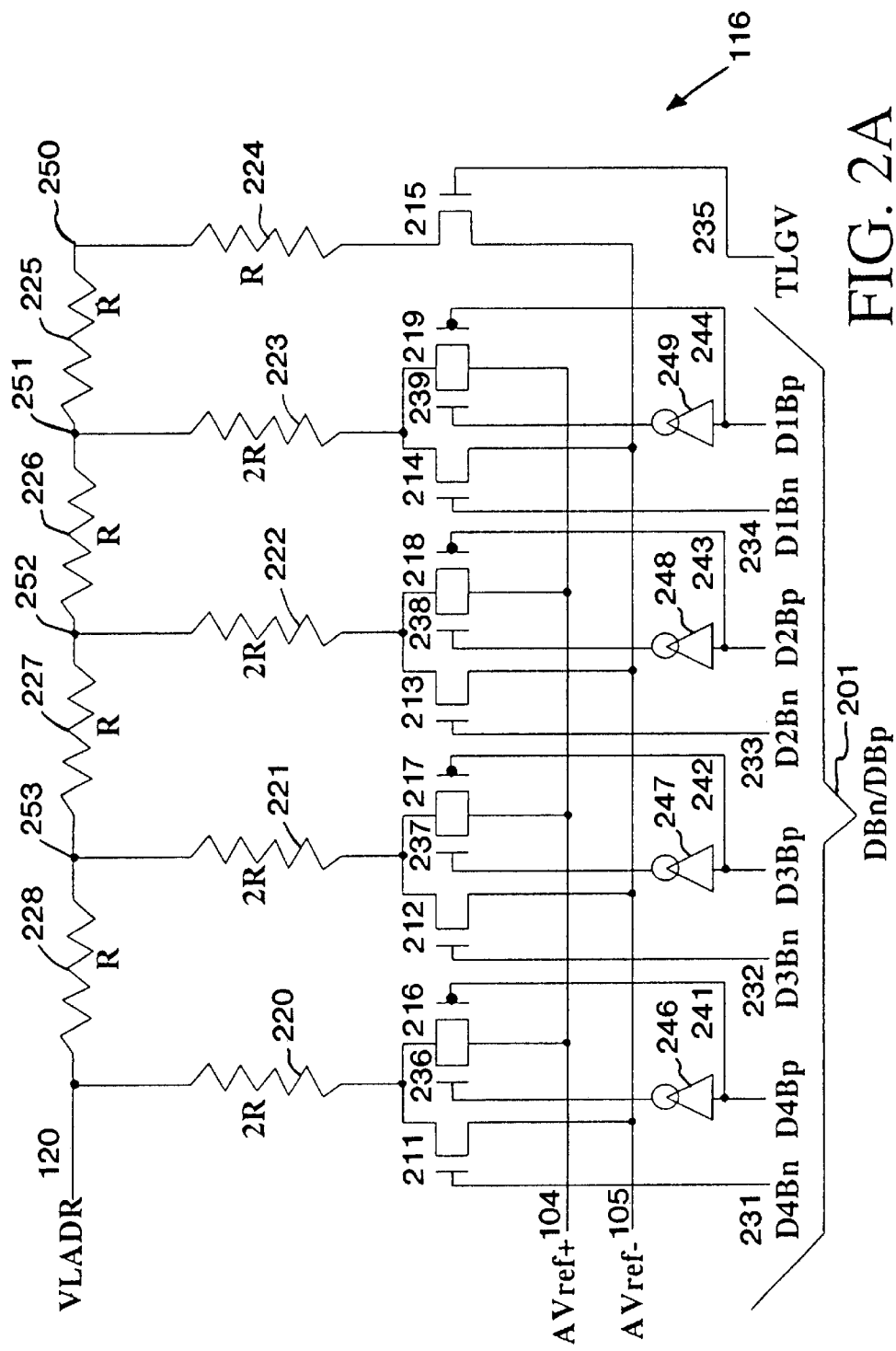
FIG. 2A is a prior art schematic diagram of a 4-bit switched R-2R ladder inverted to provide an analog voltage output.
Figure 2D:
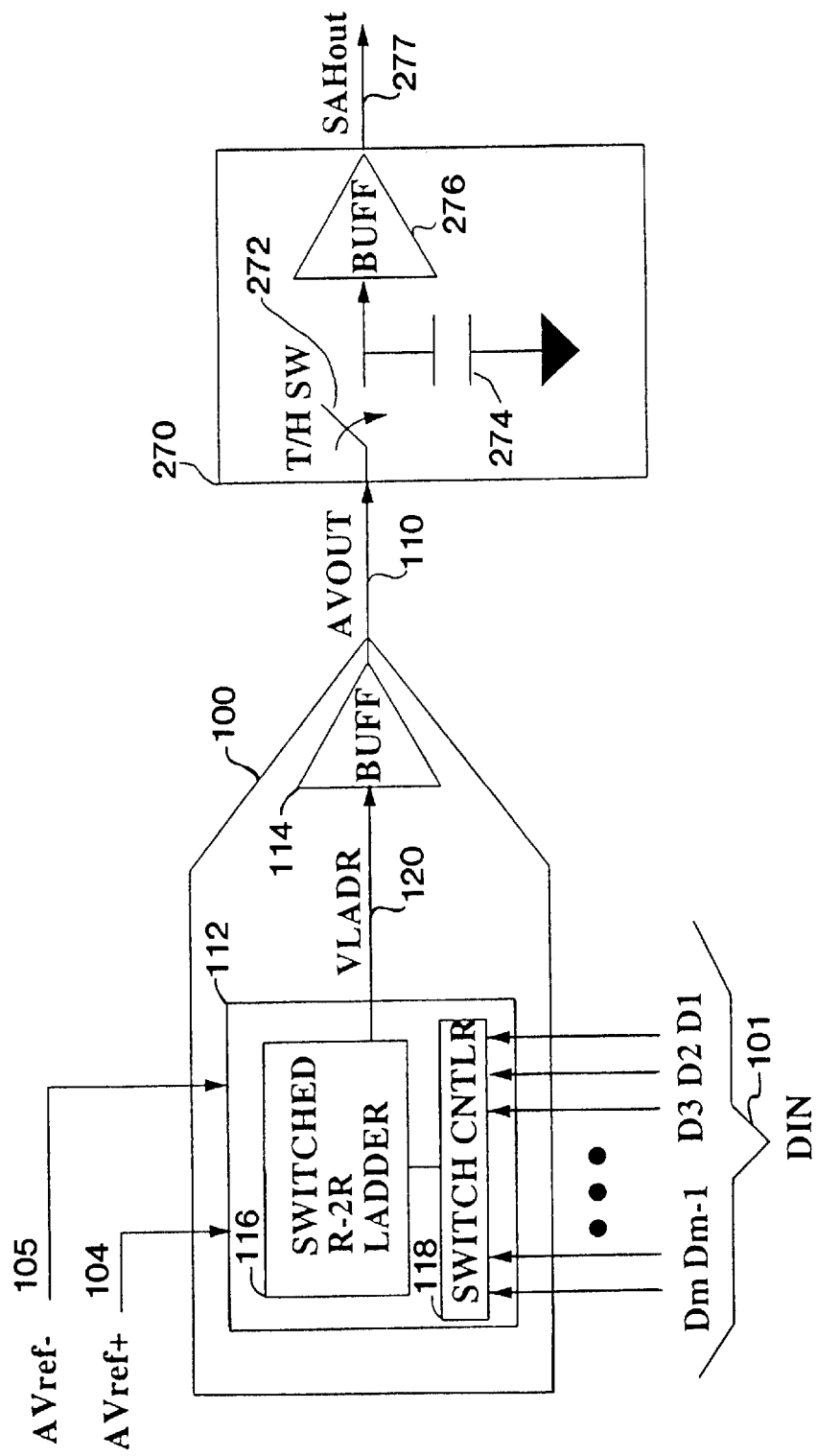
FIG. 2D is a prior art block diagram for reducing glitches in the digital to analog converter of FIG. 1.

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail so as not to unnecessarily obscure aspects of the present invention.

The present invention includes a method, apparatus and system for deglitching digital to analog converters. Briefly, the present invention includes a method, apparatus and system for deglitching digital to analog converters as described in the claims. Improved digital to analog converters (DACs) are disclosed to reduce glitch impulses associated with switch transitions. An asynchronous deglitch controller for DACs, detects transitions in the digital input code triggering a one shot. The one shot causes a sample and hold circuit to switch to the hold mode if transitions in the digital input code occur. If no transitions in the digital input are detected, the sample and hold circuit remains in the sample mode. The period of the one shot is set to mask out the primary glitch impulses. After the period of the one shot expires, the sample and hold circuit is switched back to the sample mode. Detecting transitions of the digital input in this manner, reduces switching the sample and hold circuit and therefor reduces the number of secondary glitch impulses generated by sample and hold switches.

In a synchronous deglitch controller for DACs, a load pulse, synchronous with the digital input code, triggers a one shot when a new digital input code is to be input into the DAC. The one shot generates a one shot pulse. The one shot pulse is gated by detection circuitry that detects transitions in the digital input code. If the detection circuitry detects that the new digital input code is different from the prior digital input code, the one shot pulse is allowed to cause sample and hold circuitry to switch to a hold mode. The period of the one shot is set to mask out the primary glitch impulses. After the period of the one shot expires, the sample and hold circuit is switched back to the sample mode. However, if the new digital input code is the same as the prior digital input code, the detection circuitry inhibits the one shot pulse from switching the sample and hold circuit from a sample mode to a hold mode. Detecting transitions in this manner reduces switching the sample and hold circuit and therefor reduces the number of secondary glitch impulses generated by the sample and hold switch.

Improved secondary glitch cancellation circuitry is used to further reduce secondary glitch impulses. The secondary glitch cancellation circuitry models the sample and hold circuitry, including the switches and the hold capacitor, and the input resistance of the switched R-2R ladder. The emulated secondary glitches generated by the secondary glitch cancellation circuitry are input to the negative terminal of a differential amplifier. The output from the sample and hold circuit, representing the analog voltage level generated by the switched R-2R ladder, is input to the positive terminal of the differential amp. When transitions in the sampling switch occur, they are emulated by the secondary glitch cancellation circuitry to model secondary glitches generated by the parasitics of the switch. With similar effects occurring at negative and positive terminals of the differential amp during switching, the differential amp output resists the change due to the equivalent secondary glitches provided at each terminal from the switches.

Figure 3:
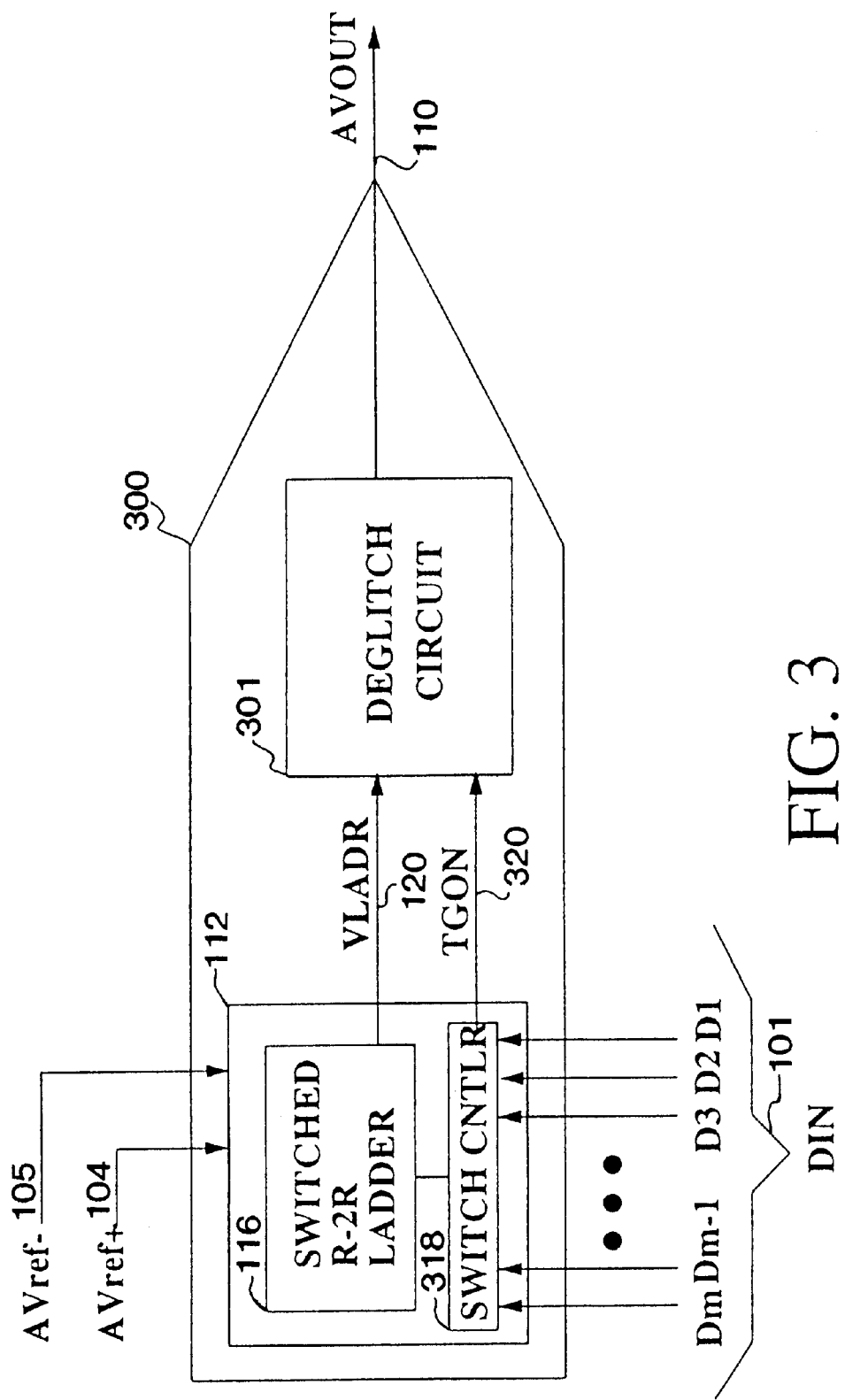
FIG. 3 is a block diagram of the digital to analog converter of the present invention for reducing glitches.

Referring now to FIG. 3, a block diagram of the digital to analog converter DAC 300 of the present invention is illustrated. DAC 300 includes a signal converter 112, and a deglitch circuit 301. DAC 300 includes AVref–105, AVref+ 104, and DIN 101 as inputs to generate the output AVOUT 110. Signal converter 112 includes the switched R-2R ladder circuit 116 and a switch controller 318 to generate levels of analog signals on VLADR 120 in response to the digital input codes on DIN 101. The type of switched R-2R ladder is not pertinent to the present invention such that various switched R-2R ladders may be utilized. The positive analog reference voltage AVref+104 and the negative reference voltage AVref–105 establish a range of voltages that the signal converter 112 will generate on VLADR 120. The switch controller 318 of the signal converter 112 generates a transfer gate ON control signal TGON 320 and the switch control signals for the switches of the switched R-2R ladder 116. Transfer gate ON control signal TGON 320 is input into the deglitcher circuit 301 to control the switch of a sample and hold circuit. When the digital input code of DIN 101 changes, VLADR 120 has varying levels of primary glitch impulses imposed thereon when transitioning to another analog voltage level. As previously described, higher amplitudes of the primary glitch impulses are generated by the major carry transitions. Additional primary glitch impulses are due to the skew of break before make timing control required to avoid crowbar current between REF+and REF– buffers.

Deglitch circuit 301 is coupled to the output VLADR 120 of the R-2R ladder. The deglitch circuit 301 performs a sample and hold of analog signals on VLADR 120 to mask out primary glitch impulses. Deglitch circuit 301 is responsive to the control signal TGON 320 to prevent the primary glitch impulses on VLADR 120 from being coupled to AVOUT 110. Furthermore, the deglitch circuit 301 includes circuitry to keep the secondary glitch impulses from reaching AVOUT 110.

Figure 4:
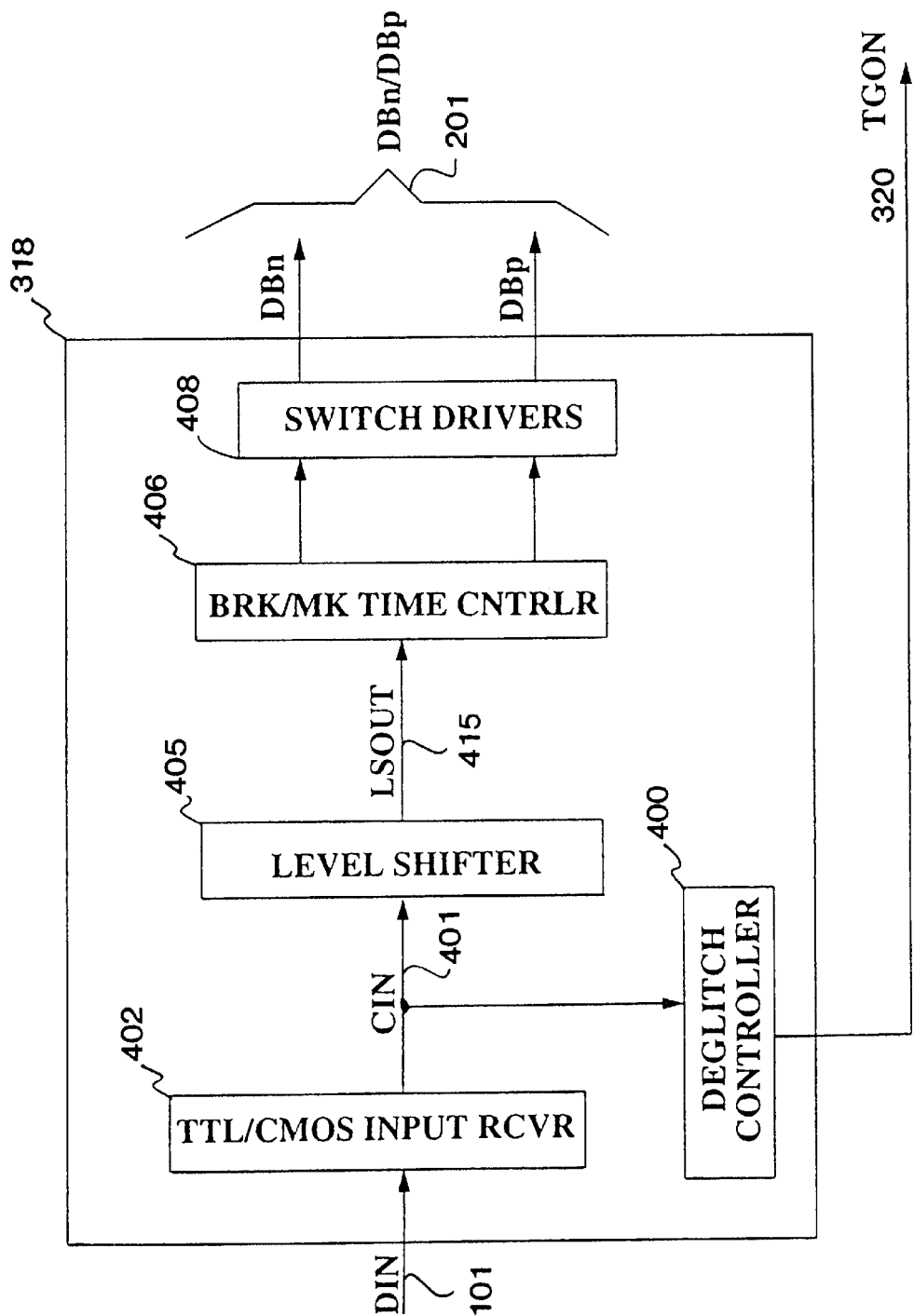
FIG. 4 is a block diagram of the switch controller of the present invention.

Referring now to FIG. 4, a block diagram of the switch controller 318 is illustrated. Switch controller 318 receives input signals DIN 101 to generate the switch control signals DBn/DBp 201 and the transfer gate ON control signal TGON 320. DBn switch control signals control the NFET switches of the R-2R ladder 116. DBp switch control signals control the PFET switches of the R-2R ladder. The control signals DBn/DBp 201 are the break before make timing control signals. The transfer gate ON control signal, TGON 320, is a deglitch control signal for controlling the deglitch circuit 301.

The switch controller 318 includes a deglitch controller 400, a TTL/CMOS input receiver 402, a level shifter 405, a break before make time controller 406, and switch drivers 408. The break before make time controller 406 may be integrated into the switch drivers 408. The deglitch controller 400 generates the transfer gate control signal TGON 320 responsive to the digital input DIN 101. TTL/CMOS input receiver 402 receives digital input codes in either TTL or CMOS voltage levels on DIN 101 and converts then to CMOS levels on CIN 401. Level shifter 405 receives the digital input CIN 401 and level shifts it to new logical HIGH and LOW voltage levels on LSOUT 415 to properly generate ON and OFF voltages for the switches in the R-2R ladder 116. The break before make timing controller 406 generates the proper break before make timing control signals to avoid crowbar currents between AVref+104 and AVref–105, which would otherwise produce additional glitches on the DAC output AVOUT 110. Switch drivers 408 convert the new logical HIGH and LOW voltage levels and generates the ON and OFF voltages for the switches in the switched R-2R ladder 116.

Figure 5A:
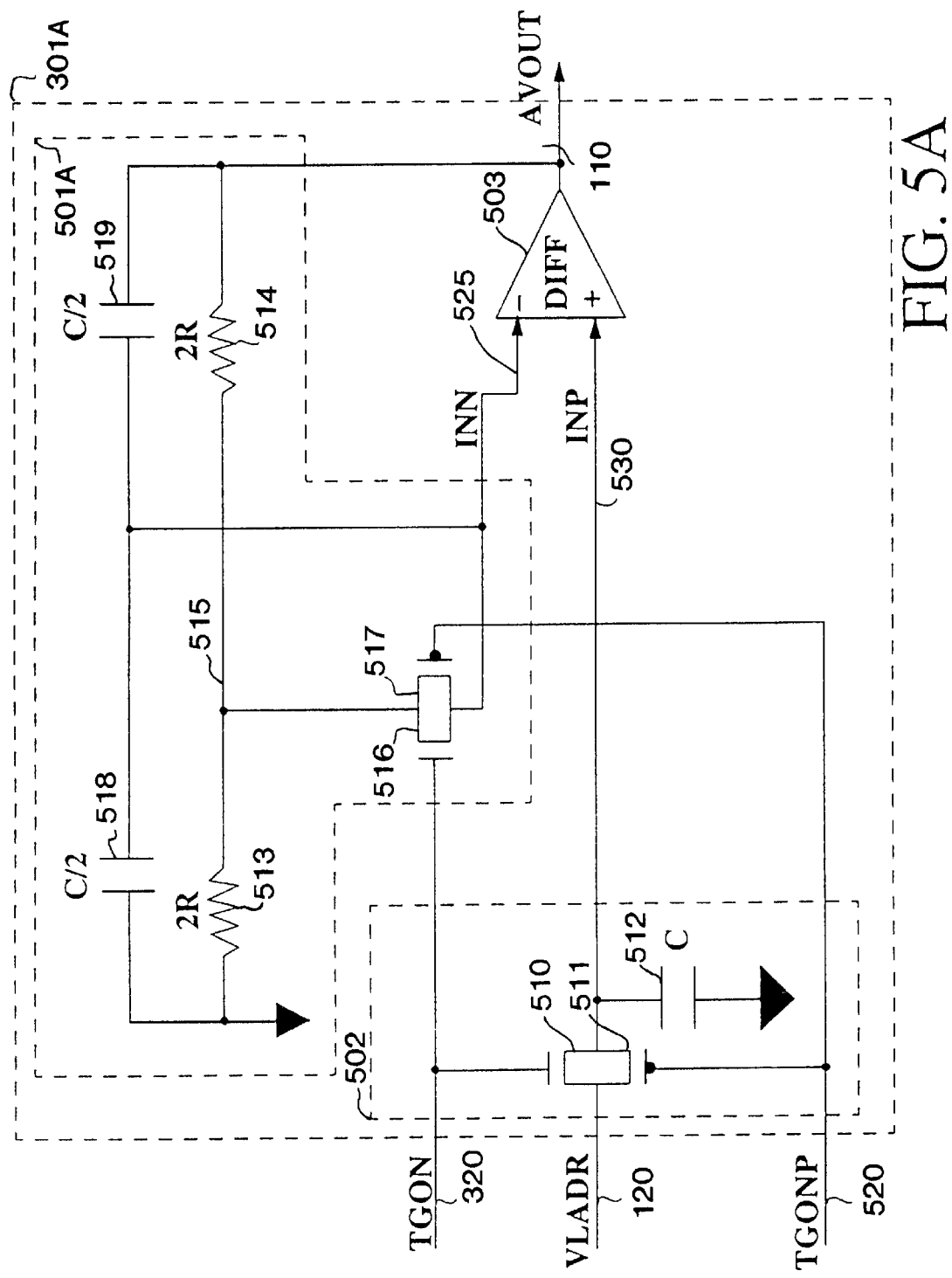
FIG. 5A is a first schematic diagram of a deglitch circuit for the present invention.

Referring now to FIG. 5A, a schematic for one embodiment of the deglitcher circuit 301 of DAC 300 is illustrated. Deglitcher circuit 301 is labeled deglitcher circuit 301A in FIG. 5A and includes a sample and hold circuit 502, a secondary glitch emulation circuit 501A and a differential amplifier 503. Sample and hold circuit 502 includes a switch comprising of NFET 510 and PFET 511 in parallel and a capacitor 512 for storing charges and holding an analog voltage level on INP 530 when the switch is open. NFET 510 has a gate coupled to the transfer gate ON control signal TGON 320, a source coupled to the R2R ladder 116, and a drain coupled to the positive input terminal of the differential amp 503 or INP 530. PFET 511 has a gate coupled to the control signal TGONP 520, a source coupled to the R2R ladder 116, and a drain coupled to the positive input terminal of the differential amp 503 or INP 530. TGONP 520 has the opposite polarity of TGON 320 and is simply generated by inverting TGON 320. NFET 510 and PFET 511 when turned ON are a closed switch and sample the analog voltage level on VLADR 120 and couple it to INP 530. NFET 510 and PFET 511 when turned OFF are an open switch and the analog voltage level on INP 530 is held by capacitor 512. Capacitor 512 is preferably on the order of 6 picofarads to hold the analog voltage level on INP 530.

Secondary glitch emulation circuit 501A includes resistors 513–514, NFET 516, PFET 517, and capacitors 518–519. Ideally, the impedances seen on each side of NFET 516/PFET 517 switch should be substantially similar to the impedances seen on each side of the NFET 510/PFET 511 switch. Additionally, NFET 516 and PFET 517 are respectively similar to NFET 510 and PFET 511 in order to emulate the charge sharing or clock feedthrough of the device parasitic capacitors and the channel charge injection upon turning OFF the PFETs and NFETs. NFET 516 and PFET 517 also respectively emulate the resistance of NFET 510 and PFET 511 to reduce voltage offset associated with an input base current of the differential amp 503. NFET 516 has the same physical dimensions, width and length, and the same control signal, TGON 320, coupled to its gate terminal as NFET 510. PFET 517 has the same physical dimensions, width and length, and the same control signal, TGONP 520, coupled to its gate terminal as PFET 511. The bodies of NFET 510, NFET 516, and the NFETs of the switched R-2R ladder, are preferably coupled to a voltage level less than or equal to AVref−105 in order to avoid forward bias of any parasitic diodes. The bodies of PFET 511, PFET 517, and the PFETs of the switched R-2R ladder, are preferably coupled to a voltage level greater than or equal to AVref+104. Because AVref+and AVref−are usually precision voltage levels without sufficient capability of withstanding transients, other voltage sources are usually utilized to provide the body bias. Thus, NFET 516/PFET 517 switch is substantially similar to the NFET 510/PFET 511 switch and are opened and closed simultaneously by the same control signal.

Resistors 513–514 each have a resistance of two units of R for the R-2R ladder 116. R is preferably on the order of forty two kilo (42K) ohms. In a small signal model, resistors 513 and 514 are coupled in parallel together and have an equivalent resistance of one unit of R. This is substantially similar to the resistance of the switched R-2R ladder 116 when looking into it at its output VLADR 120. Capacitor 518 and 519 are half the capacitance value of capacitor 512, preferably 3 picofarads each. In a small signal model, capacitor 518 and 519 are coupled in parallel together and are equivalent to the capacitance of capacitor 512. The circuit configuration of capacitors 518–519 with the NFET 516/PFET 517 switches turned OFF, assures that a negative feedback path is maintained in hold mode and thus prevents INN 525, the negative input terminal of the differential amp 503, from floating. Additionally, no phase shift occurs between the output AVOUT 110 of the differential amp 503 and the input INN 525. Assuming the ON resistance of the switches is zero and as a consequence of the configuration of the RC feedback network, there is no phase shift because of pole-zero cancellation (also known as scope probe effect). In comparison with an amplifier circuit having a gain of two without capacitors, adding capacitors 518 and 519 to provide charge emulation does not alter the phase or gain margin.

Secondary glitch cancellation is performed by the differential amplifier 503 in conjunction with the secondary glitch emulation circuit 501A and the sample and hold circuit 502. Differential amplifier 503 has a negative input terminal INN 525 coupled to the output of the secondary glitch emulation circuit 501A and a positive input terminal INP 530 coupled to the output of the sample and hold circuit 502 having the appropriate analog signal level representative of the digital input code. Switches 516 and 517, being dummy switches, generate emulated charges which are injected into capacitors 518–519 to generate emulated voltage spikes. These emulated voltage spikes are also referred to as emulated secondary glitch impulses. The emulated voltage spikes emulate the voltage spikes of the secondary glitch impulses on capacitor 512. The emulated voltage spikes are input into the negative input terminal INN 525 of the differential amplifier 503. The control of switches 516 and 517 is identical to the control of switches 510 and 511 respectively. Thus, the emulated voltage spikes and the secondary glitch impulses are substantially simultaneously provided to the respective inputs of the differential amplifier 503. The differential amplifier 503 rejects common mode voltages on INN 525 and INP 530. Because the emulated voltage spikes and the secondary glitch impulses at INN 525 and INP 530 are substantially identical, the voltage difference between INN and INP is substantially zero. As a result, secondary glitch impulses do not appear on the amplifier output AVOUT 110.

Figure 5B:
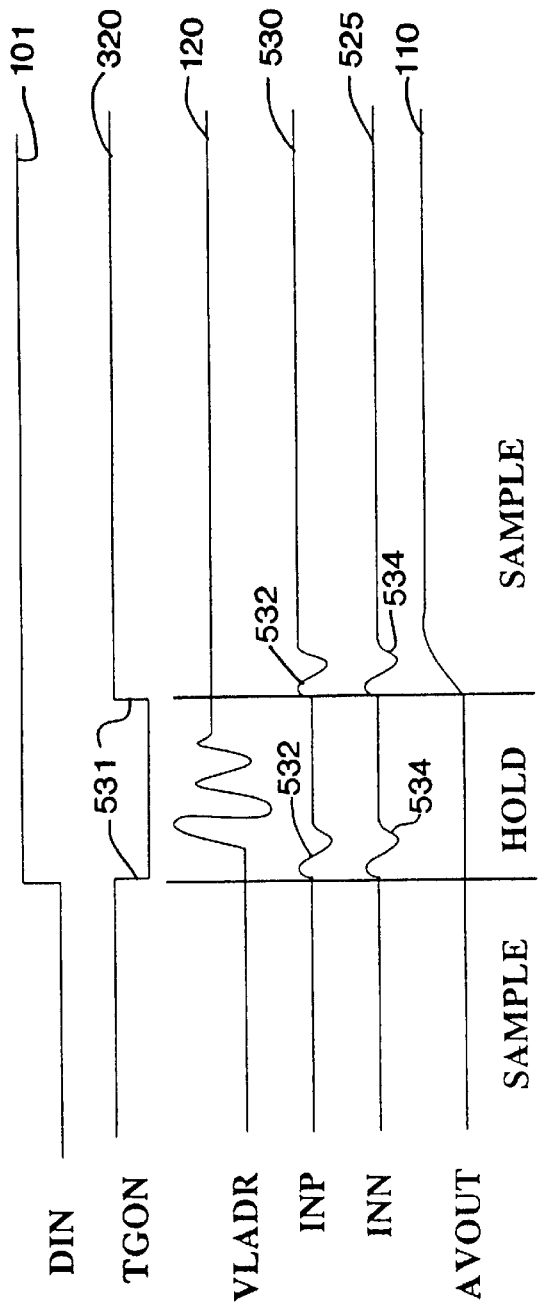
FIG. 5B is a timing diagram of signals associated with the deglitch circuitry of the present invention.

Referring now to FIG. 5B, a waveform timing diagram associated with the deglitch circuit 301 is illustrated. Upon transition of TGON 320 and TGONP 520 at times 531, secondary glitch impulses 532 are formed on INP 530. At times 531, the charge emulation circuit 501 forms emulated voltage spikes or emulated secondary glitch impulses 534 on INN 525, substantially similar to the secondary glitch impulses 532 on INP 530. The secondary glitch impulses 532 and the emulated secondary glitch impulses 534 are nearly identical because the switches and the impedances (resistance and capacitance) on each side of the switches are substantially matched. The emulated secondary glitch impulses 534 and the secondary glitch impulses 532, respectively formed on INN 525 and INP 530, are common mode voltages to the differential amplifier 503. The differential amplifier 503 substantially rejects these common mode voltages.

Figure 5C:
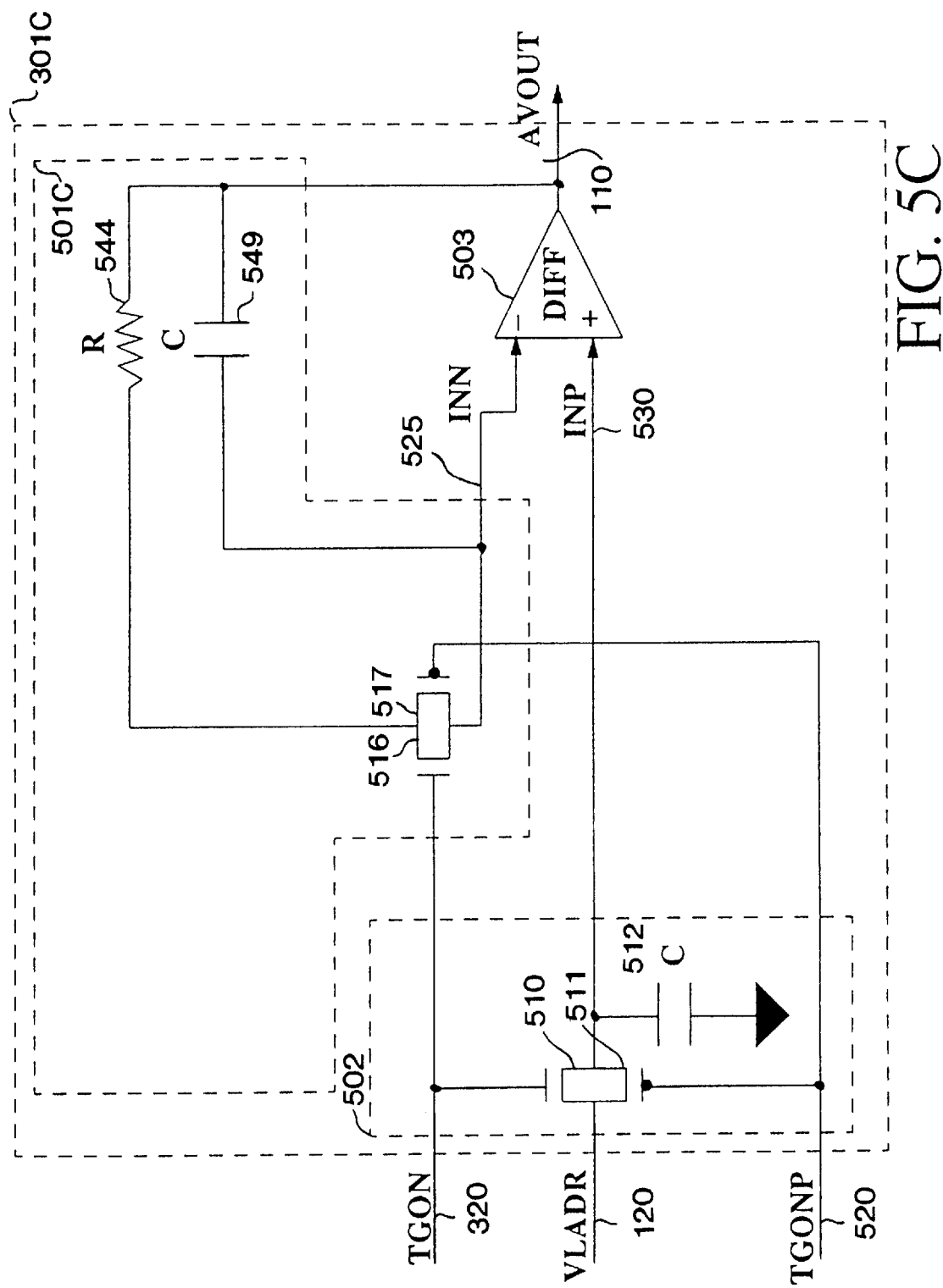
FIG. 5C is a second schematic diagram of a deglitch circuit for the present invention.

Referring now to FIG. 5C, a schematic for another embodiment of the deglitcher circuit 301 of DAC 300 is illustrated. Deglitcher circuit 301 is labeled deglitcher circuit 301C in FIG. 5C and includes the sample and hold circuit 502 and a secondary glitch emulation circuit 501C. The functionality of the deglitcher circuit 301C is similar to the functionality of the deglitcher circuit 301A. Like numbered elements provide similar functionality. The circuit configuration of the secondary glitch emulation circuit 501C differs from that of the secondary glitch emulation circuit of 501A in the amount of closed loop gain provided. The closed loop gain provided in the deglitcher circuit 301A is two. The closed loop gain provided in the deglitcher circuit 301C is one. This illustrates how to design alternate embodiments of the deglitcher circuit 301 with differing closed loop gains.

In comparing the secondary glitch emulation circuits of FIG. 5C with FIG. 5A, resistors 513 and capacitor 518 are not present and resistor 514 and capacitor 519 are replaced with resistor 544 and capacitor 549 respectively. The resistance of resistor 544 is one unit of resistance, R, and the capacitance of capacitor 549 is one unit of capacitance, C. Resistor 544 emulates the resistance of the switched R-2R ladder as does resistors 513 and 514 in secondary glitch emulation circuit 501A. Capacitor 549 emulates the capacitance of the holding capacitor 512 in the sample and hold circuit 502 as does capacitors 518 and 519 in secondary glitch emulation circuit 501A. Capacitor 549 also provides continuous negative feedback around differential amplifier 503. The resistor 544, having the unit resistance value, provides a closed loop gain of one.

Figure 5D:
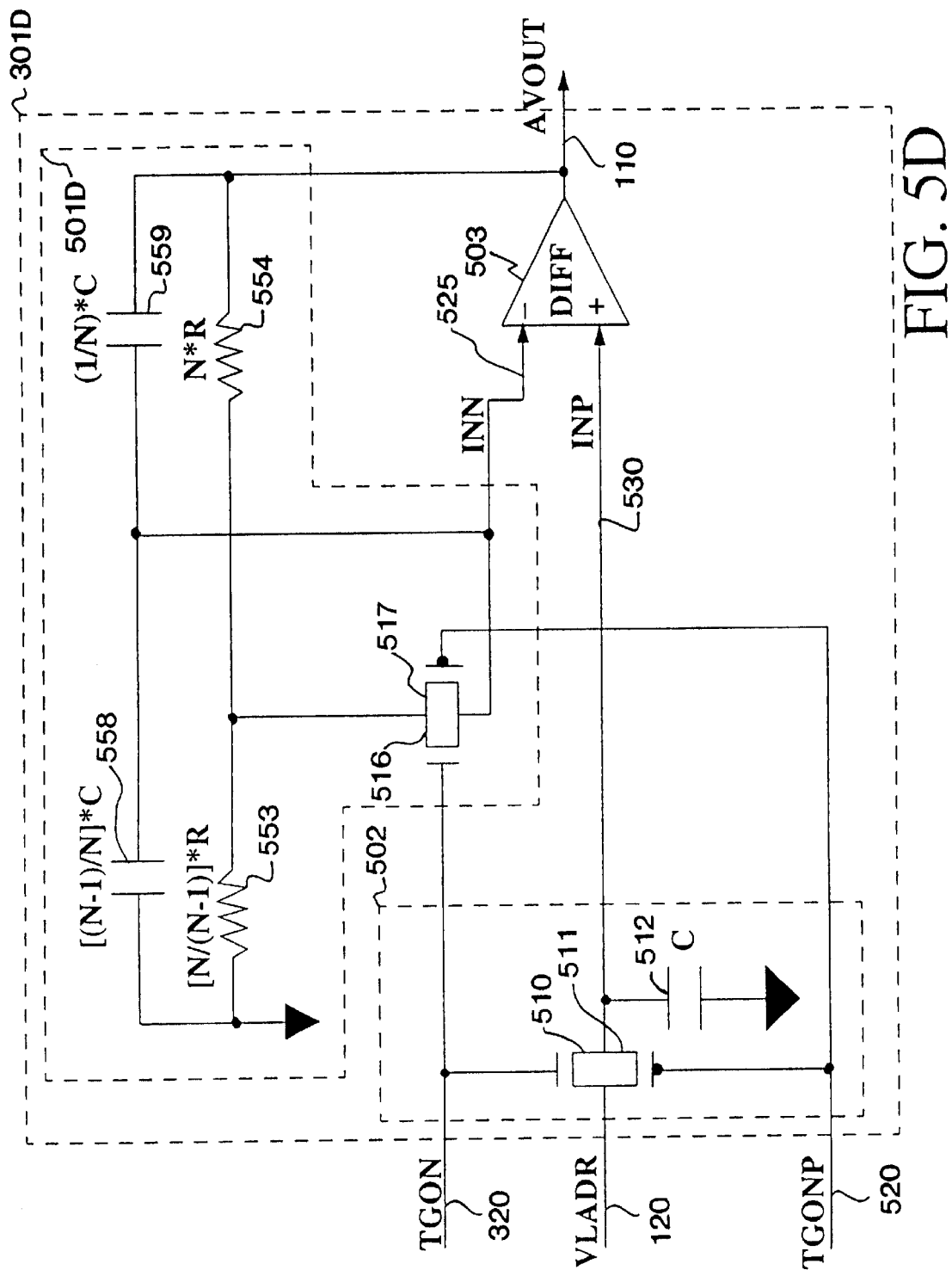
FIG. 5D is a third schematic diagram of a deglitch circuit for the present invention.

Referring now to FIG. 5D, a schematic for another embodiment of the deglitcher circuit 301 of DAC 300 is illustrated. Deglitcher circuit 301 is labeled deglitcher circuit 301D in FIG. 5D and includes the sample and hold circuit 502 and a secondary glitch emulation circuit 501D. The functionality of the deglitcher circuit 301D is similar to the functionality of the deglitcher circuit 301A. The circuit configuration of the secondary glitch emulation circuit 501D differs from that of the secondary glitch emulation circuit of 501A in the amount of closed loop gain provided. The closed loop gain provided in the deglitcher circuit 301A is two. The closed loop gain, N, provided in the deglitcher circuit 301D is a selectable value. N may be a whole number or a fractional value. This illustrates how to design alternate embodiments of the deglitcher circuit 301 with differing output gains.

In comparing the secondary glitch emulation circuit 501D of FIG. 5D with circuit 501A of FIG. 5A, resistors 513 and 514 are replaced with resistors 553 and 554 respectively. Capacitors 518 and 519 are replaced with capacitors 558 and 559 respectively. The resistance of resistor 553 is equal to [N/(N−1)]*R. The resistance of resistor 554 is equal to N*R. The parallel resistance of resistor 553 and 554 emulate the resistance R of the switched R-2R ladder as does resistors 513 and 514 in secondary glitch emulation circuit 501A. The parallel resistor 553 and 554 compensate for voltage offset in the differential amplifier 503 due to base currents of the input terminals, INN and INP. The capacitance of capacitor 558 is equal to [(N−1)/N]*C. The capacitance of capacitor 559 is equal to (1/N)*C. Capacitors 558 and 559 in parallel emulate the capacitance, C, of the holding capacitor 512 in the sample and hold circuit 502 as does capacitors 518 and 519 in secondary glitch emulation circuit 501A. The parallel capacitance or capacitors 558 and 559 are provided for charge emulation. Additionally, no phase shift occurs between the output AVOUT 110 of the differential amp 503 and the input INN 525. Assuming the ON resistance of the switches is sufficiently small compared with the unit resistance R, no phase shift occurs between AVOUT 110 and INN 525. In FIG. 5D assuming the dummy switch is ON and has a sufficiently small ON resistance, an impedance ($Z_1$) of resistor 553 and capacitor 558 in parallel between ground and INN 525 can be expressed by the admittance equation:

$$\frac{1}{Z_1} = \left(\frac{N-1}{N}\right) * \frac{1}{R} + \left(\frac{N-1}{N}\right) * SC$$

where S is jω. Similarly, an impedance ($Z_2$) of resistor 559 and capacitor 554 in parallel between AVOUT 110 and INN 525 can be expressed by the admittance equation:

$$\frac{1}{Z_2} = \left(\frac{1}{N}\right) * \frac{1}{R} + \left(\frac{1}{N}\right) * SC$$

where S is jω.

The transfer function of the feedback network between AVOUT 110 and INN 525 may be expressed by the equation:

$$\frac{V_{INN}}{V_{AVOUT}} = \frac{Z_1}{Z_1 + Z_2} = \frac{1/Z_2}{1/Z_1 + 1/Z_2}$$

Substituting in the values for impedance ($Z_1$) and impedance ($Z_2$) from the admittance equations it becomes:

$$\frac{V_{INN}}{V_{AVOUT}} = \frac{\left(\frac{1}{N}\right)*\frac{1}{R}+\left(\frac{1}{N}\right)*SC}{\left[\left(\frac{N-1}{N}\right)*\frac{1}{R}+\left(\frac{N-1}{N}\right)*SC\right]+\left[\left(\frac{1}{N}\right)*\frac{1}{R}+\left(\frac{1}{N}\right)*SC\right]}$$

$$\frac{V_{INN}}{V_{AVOUT}} = \frac{\left(\frac{1}{N}\right)*\left[\frac{1}{R}+SC\right]}{\left[\left(\frac{1}{N}\right)*\frac{1}{R}+\left(\frac{N-1}{N}\right)*\frac{1}{R}\right]+\left[\left(\frac{1}{N}\right)*SC+\left(\frac{N-1}{N}\right)*SC\right]}$$

$$\frac{V_{INN}}{V_{AVOUT}} = \left(\frac{1}{N}\right) * \frac{[1/R+SC]}{[1/R+SC]}$$

and the final expression becomes:

$$\frac{V_{INN}}{V_{AVOUT}} = \frac{1}{N}$$

Thus, the configuration of the RC feedback network eliminates phase shift because of pole-zero cancellation (also known as scope probe effect). Capacitor 559 also provides continuous negative feedback around differential amplifier 503 in hold mode when the dummy switch (PFET 517/ NFET 516) is OFF or open. The closed loop gain provided by the configuration of circuit 501D is N.

Having a closed loop gain of magnitude greater than one, amplifies the analog voltage levels from VLADR 120. The amplification N provided by the closed loop gain, allows for reduction in the range of voltages on VLADR 120. This can be seen from the equation:

$$VLADR(\max) - VLADR(\min) = \frac{AVOUT(\max) - AVOUT(\min)}{N}$$

Thus, the analog output voltage AVOUT 110 can have a much wider range of voltage levels than VLADR 120 if the close loop gain is greater than one. The closed loop gain, N, can be selected such that the range of voltage levels for VLADR 120 can be reduced to less than the breakdown voltage of switches in the DAC, while retaining a wide range of voltage levels for AVOUT 110. The switched R-2R ladder, with switches having a low CMOS breakdown voltage, can have its range of output voltages on VLADR 120 amplified to provide a wider range of output voltages on AVOUT 110. Providing a differential amp 503 and charge emulation circuit 501D with a closed loop gain greater than one, allows one to design for higher voltage swings on AVOUT 110 that could not otherwise be feasible with CMOS switches having CMOS breakdown voltages which are relatively low in comparison. In particular, the T/H switch (PFET 511/NFET 510) of the sample and hold circuit 502 may have a CMOS breakdown voltage much less than the voltage range on AVOUT 110. Thus, providing a closed loop gain greater than one, can allow the T/H switch to operate without breaking down.

Figure 6:
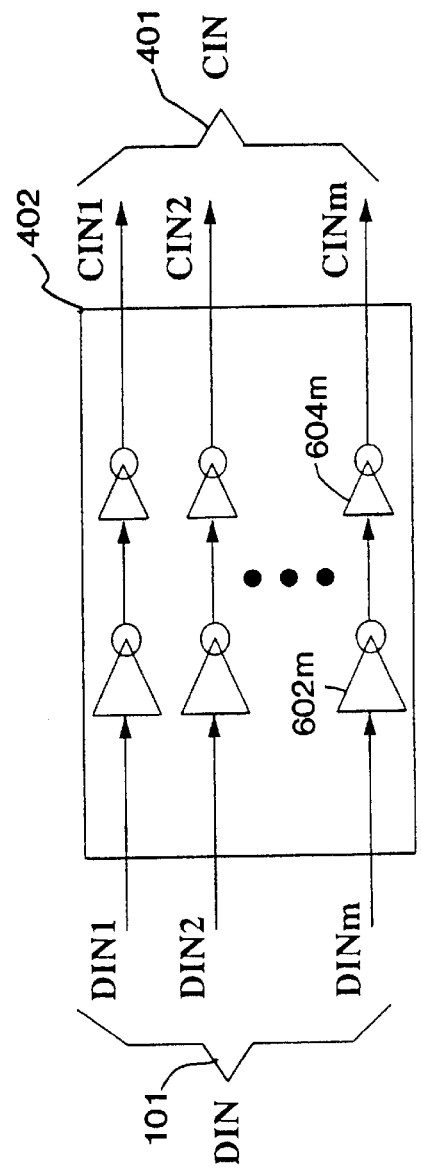
FIG. 6 is a block diagram of an TTL/CMOS input receiver for the present invention.

Referring now to FIG. 6, a schematic diagram of a TTL/CMOS input receiver 402 is illustrated. TTL (transistor-transistor logic) or CMOS (complementary metal oxide semiconductor) input levels may be supplied to input DIN 101 of DAC 300. The TTL/CMOS input receiver 402 converts these input levels to CMOS voltage levels on output CIN 401. The TTL/CMOS input receiver 402 includes an inverter 602m having an input coupled to DIN 101 and an output coupled to the input of inverter 604m. Inverter 604m has its output coupled to CIN 401 to generate non-inverted signals. Inverter 602m has its PFET and NFET ratioed to have an input switch point midway between TTL levels which is also satisfactory for receiving CMOS levels. Inverter 604m buffers and rectifies the inversion generated by inverter 602m.

Figure 7A:
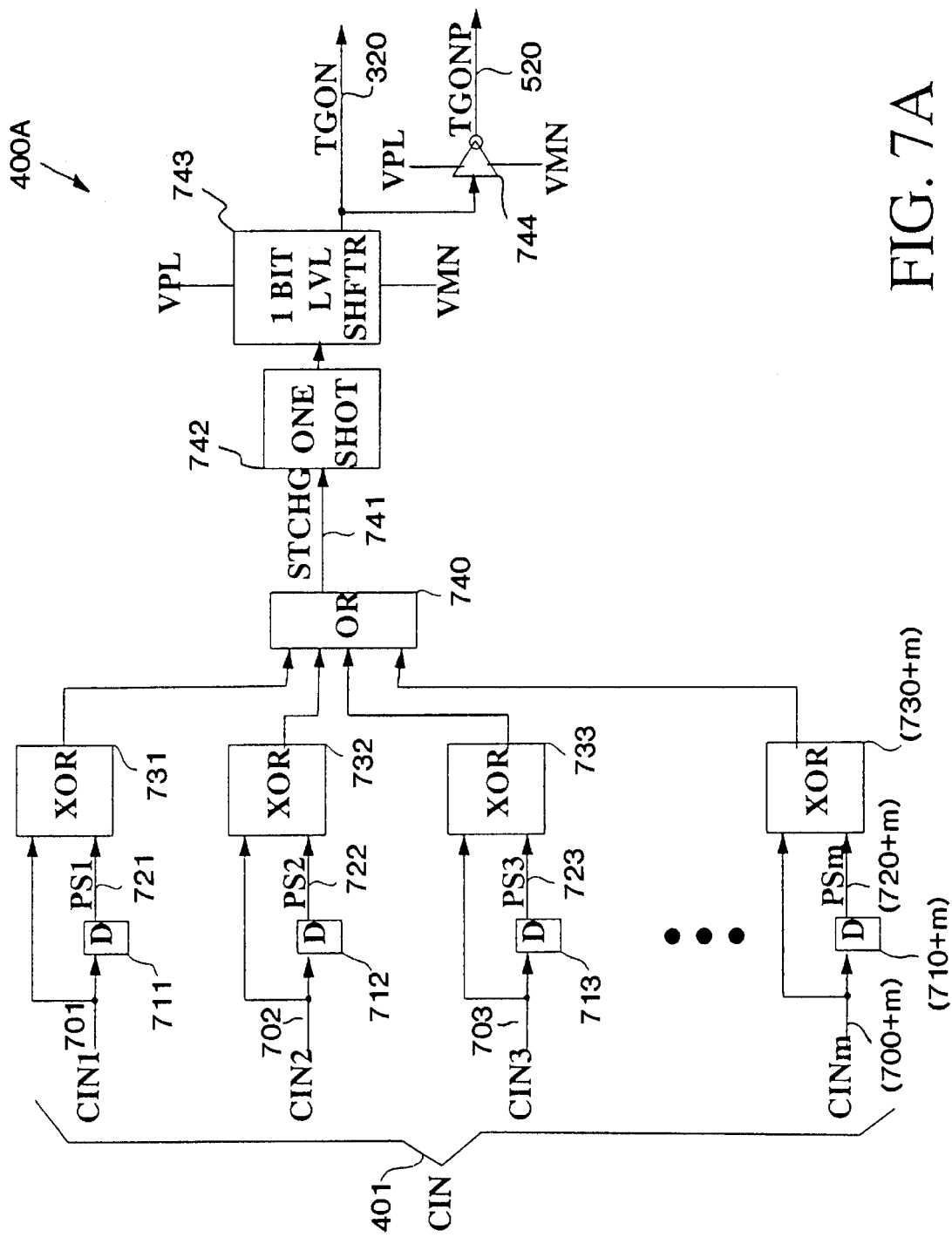
FIG. 7A is a schematic diagram of an asynchronous deglitch controller to control the deglitch circuitry of the present invention.

Referring now to FIG. 7A, a first embodiment of the deglitch controller 400 is illustrated. Deglitch controller 400A illustrated in FIG. 7A is asynchronous. Deglitch controller 400A receives CIN 401, representative of the digital input code on DIN 101, and generates the transfer gate ON control signal TGON 320. Deglitch controller 400A includes delay elements 711 through (710+m), exclusive OR gates 731 through (730+m), OR gate 740, one shot timer 742, one bit level shifter 743 and inverter 744. Delay elements 711 through (710+m) are utilized to hold the prior state of CIN 401 on nodes PS0-PSm 721 through (720+m). Delay elements 711 through (710+m) are simple delay elements such as a series of inverters generating a noninverting output for comparison by the exclusive OR gates 731 through (730+m). Exclusive OR gates 731 through (730+m) compare the prior state of CIN with a new state of CIN. If there is a change of state from a prior state, one or more outputs of the exclusive OR gates 731 through (730+m) generates an active high pulse. The pulse width of the active high pulse is equivalent of the delay time through the delay elements. Outputs of the exclusive OR gates 731 through (730+m) are coupled to inputs of OR gate 740. If any one of the exclusive OR gates transitions to a high level, the output of the OR gate 740, state change signal STCHG 741, goes high and triggers one shot 742 to generate a low level pulse on its output. The output from the one shot pulse 742 is coupled to the one bit level shifter 743. The one bit level shifter 743 has VPL and VMN included as power supply sources and shifts the digital levels of the one shot pulse that are input into logic levels having VPL and VMN as the corresponding voltage levels. The one bit level shifter 743 functions in a similar manner as the level shifter 405 described herein. VPL and VMN are fixed positive and negative voltages generated from the positive and negative power supplies provided to the DAC. VPL and VMN are the respective voltage levels for switching the T/H switch (NFET 510/PFET 511) in the sample and hold circuit 502. The difference between VPL and VMN voltage levels is less than the breakdown voltage of the switches. Thus, CMOS switches (PFET or and/or NFET) having a breakdown voltage less than the power supply range may be used in the T/H switch.

The formation of VPL and VMN and greater detail of the level shifter are described in the patent application "METHOD AND APPARATUS FOR SWITCHING LOW VOLTAGE CMOS SWITCHES IN HIGH VOLTAGE DIGITAL TO ANALOG CONVERTERS" by FANG et al to be assigned to Maxim Integrated Products, Inc. which this application cross references. The one bit level shifter 743 differs in that only one bit is shifted to the appropriate level.

Transfer gate control signal TGON 320 is coupled into the input of inverter 744. Inverter 744 inverts transfer gate control signal TGON 320 into a complimentary control signal TGONP 520 having voltage levels VPL and VMN as its logical levels. TGON 320 and TGONP 520 are coupled into the NFET 510 and the PFET 511 respectively of the sample and hold circuit 502 in the deglitch circuit 301.

Now referring to FIGS. 7A and 7B, a timing diagram illustrates the timing of signals associated with the deglitch controller 400A. Initially deglitch controller 400A is in a sample mode 745 with the switch of the sample and hold circuit closed to sample VLADR 120. It then switches to a hold mode 746 opening the switch of the sample and hold circuit. After a period of time, it returns to the sample mode 747 closing the switch of the sample and hold circuit. Wave form 101m illustrates a bit DINm of the DIN 101 changing state on the rising edge 750. The TTL/CMOS level converter 402 generates bit CINm (700+m) of CIN 401 having a response slightly delayed from the change in state of DINm. The output response on PSm (720+m) is delayed by the delay element (710+m) for a delay time period in response to input changes on CINm (700+m). This preserves the prior state of CINm for the period of delay time before a new state of CINm appears on the output PSm (720+m). Exclusive-ORing CINm with PSm by exclusive-OR gate (730+m) generates a high pulse representing the change in state which passes through OR gate 740 and generates pulse 751 of the state change control signal STCHG 741. Pulse 751 of state change control signal STCHG 741 triggers the one shot 742 to generate a pulse which is level shifted into the hold pulse 752 for the transfer gate control signal TGON 320. The one bit level shifter 743 shifts the pulse from the one shot 742 into levels of VPL and VMN as seen in the waveform for TGON 320. The change in state of bit DINm illustrated by wave form 101m causes the output VLADR 120 to change state to a different analog level and generates glitch impulses 753. The width of the hold pulse 752 is dependent on the period of the one shot pulse generated by the one shot 742. The width of the hold pulse 752 is preferably set such that it allows sufficient time to allow the glitch impulses to settle before allowing the sample and hold circuit 502 to resample VLADR 120. After hold pulse 752 ends, the sample and hold circuit returns to sampling the VLADR 120, coupling VLADR 120 to INP 530. Upon return to sample mode, sample and hold circuit 502 causes the output AVOUT 110 to transition to a new analog output level 754 as illustrated in FIG. 7B. Thus, deglitch controller 400A asynchronously generates the hold pulse 752 of the transfer gate ON control signal TGON 320 for controlling the sampling and holding of the sample and hold circuit 502.

Figure 8A:
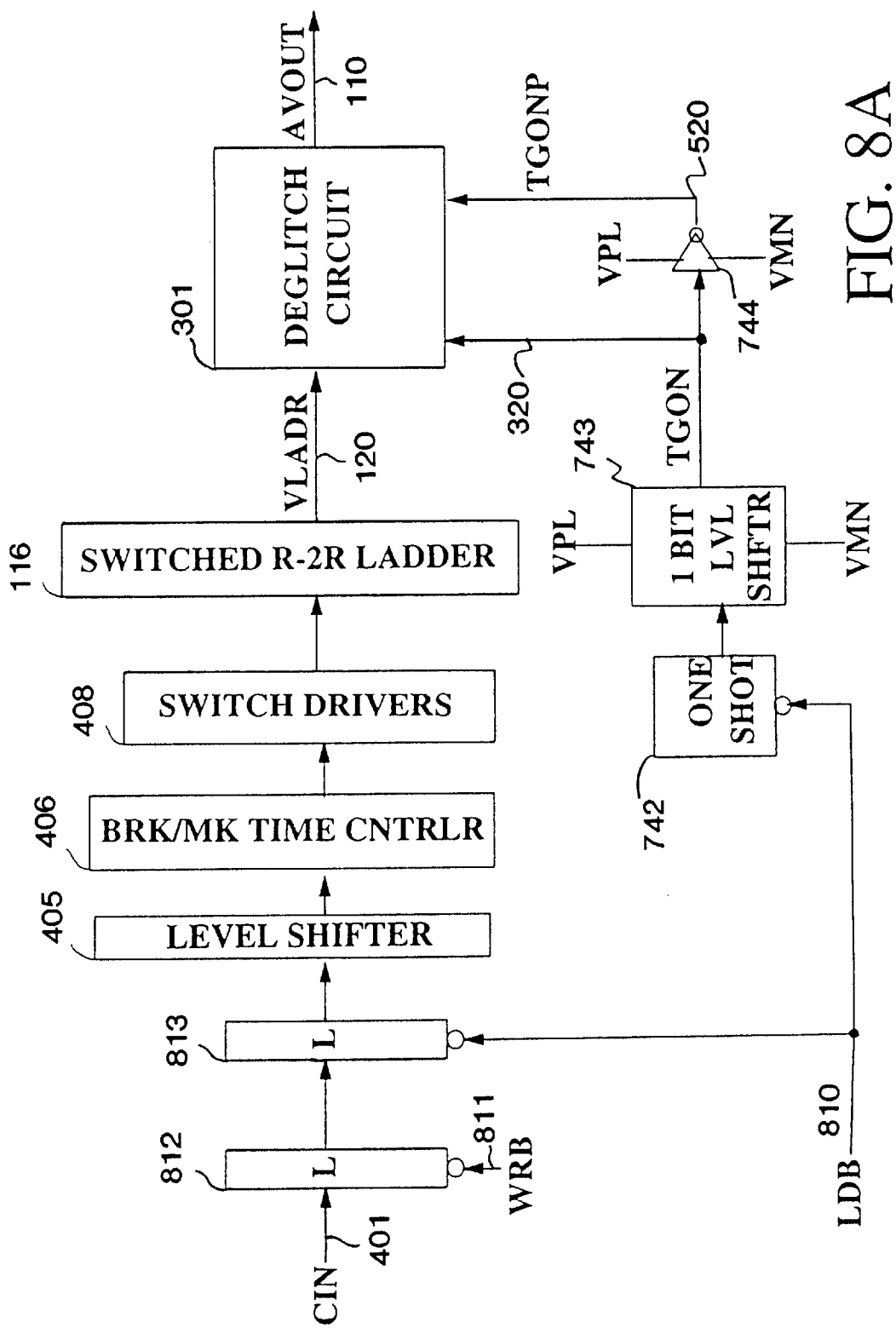
FIG. 8A is a schematic diagram of a synchronous deglitch controller to control the deglitch circuitry of the present invention.

Referring now to FIG. 8A, a second embodiment of the deglitch controller of the present invention is illustrated. The deglitch controller illustrated in FIG. 8A is a synchronous deglitch controller to control the sampling and holding of the sample and hold circuit 502 of the deglitch circuit 301. The synchronous deglitch controller illustrated in FIG. 8A uses the one shot pulse generator 742, the one bit level shifter 743 and inverter 744 to control the deglitch circuit 301. In this embodiment, the switch controller 318 further includes latches 812 and latches 813. Latches 812 sample the input CIN 401 when write signal WRB 811 is strobed. When LDB 810 is strobed low, latches 813 sample the output from latches 812. The output of latches 813 is coupled to the input of the level shifter 405. When the LDB 810 is strobed low, the R-2R ladder is updated. Updates in the R-2R ladder can cause glitches to occur on VLADR 120 before settling to a steady state value. Thus when LDB 810 is strobed low, it is appropriate for the deglitch circuit 301 to go into a hold mode. LDB 810 triggers the one shot pulse generator 742 to generate one shot pulses. The one shot pulses are level shifted by the one bit level shifter 743 to form level shifted logic levels for the one shot pulses on TGON 320. VPL and VMN are the voltage levels for the level shifted logic levels for the T/H switch to avoid the transistor breakdown voltage. When TGON 320 is a logical low, it turns OFF the switch of the sample and hold circuit and begins a hold mode having a duration of the period of the one shot pulse. When TGON 320 is a logical high, it turns ON the T/H switches in order to sample the signals at the input of the sample and hold. Inverter 744 inverts transfer gate control signal TGON 320 into its complimentary control signal having the VMN and VPL voltage levels for the logic levels of the TGONP 520 signal.

Figure 8B:
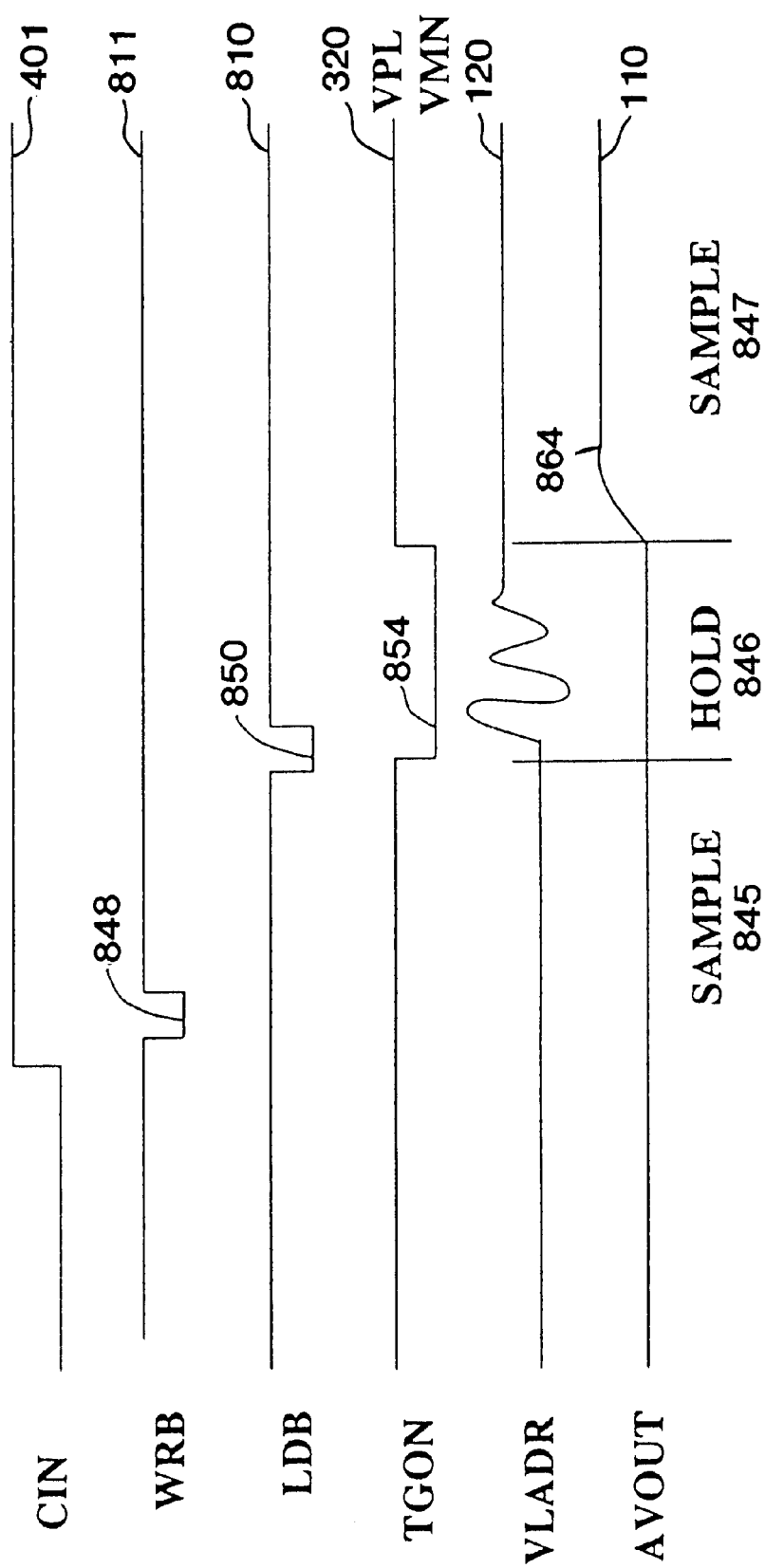
FIG. 8B is a timing diagram of signals generated by synchronous deglitch controller of FIG. 8A for the deglitch circuitry of the present invention.

Referring now to FIGS. 8A and 8B, a timing diagram illustrates the timing of signals associated with second embodiment of the present invention. The synchronous deglitch controller is initially in a sample mode 845 with the T/H switch of the sample and hold circuit closed (ON) to sample VLADR 120. It then switches to a hold mode 846 by opening the T/H switch (OFF). After a period of time, control returns to a sample mode 847 by closing the T/H switch of the sample and hold circuit. Load pulse LDB 810 signals the update of the DAC 300 with a new digital input code. Write signal WRB 811 is a signal to write new data into latches 812. The one shot 742 generates a one shot pulse. The level shifter 743 receives the one shot pulses at its input and level shifts the logic levels into VPL and VMN into the hold pulse 854 on its output TGON 320. Each time the load pulse LDB 810 triggers the one shot with pulse 850 a hold pulse 854 is generated. The one bit level shifter 743 shifts the pulse from the one shot 742 into levels of VPL and VMN as seen in the waveform for TGON 320. The hold pulse 854 substantially allows the primary glitch impulses to settle out and the voltage on VLADR 120 to reach a steady state before re-sampling. After the transfer gate ON signal TGON 320 goes high, it allows the sample and hold circuit 502 to resample VLADR 120. With the T/H switch (PFET 511 and NFET 510) turned ON, VLADR 120 is connected to INP 530 of the differential amp 503 through the T/H switch. When sampling, the differential amp 503 receives the steady state value on VLADR 120 and allows the output AVOUT 110 to come to an analog level 864 representative of the digital input code. Thus, deglitch controller of FIG. 8B synchronously controls the generation of the one shot pulse 854 for the transfer gate ON control signal TGON 320.

Figure 9:
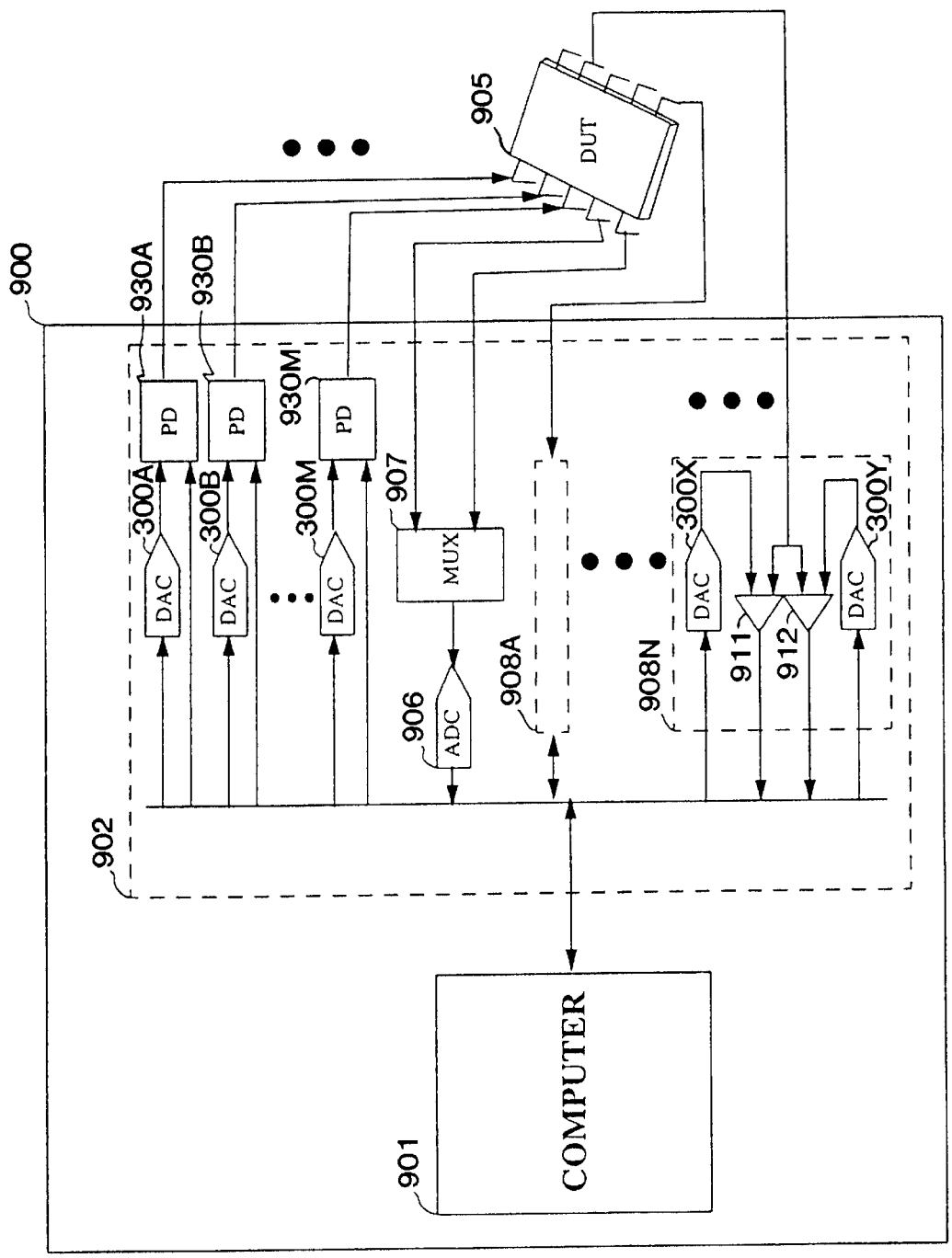
FIG. 9 is a block diagram of automated test equipment (ATE) of the present invention.

Referring now to FIG. 9, a block diagram illustrating an automated test equipment (ATE) 900 incorporating the present invention is illustrated. The ATE 900 incorporates a number of DACs 300 of the present invention for converting digital signals into analog signals. ATE is particularly sensitive to glitch impulses on the output of a DAC because it is usually driving sensitive PN junctions and input pins of semiconductor devices. Thus glitch control in a DAC within an ATE is very important. The ATE 900 also incorporates an analog to digital converter ADC 906 for converting analog signals into digital signals. The ATE 900 includes a computer 901 coupled to a test station 902. The test station 902, sometimes referred to as a test head, includes the analog to digital converter ADC 906 and the digital to analog converters DAC 300A, 300B through 300M for testing packaged integrated circuits 905, integrated circuits in unpackaged or wafer form, or other electronic devices. Through pin driver and load circuits (PD) 930A–930M of the ATE 900, the DACs 300A, 300B through 300M couple analog and digital voltage levels to the device under test (DUT), such as integrated circuit 905, to determine if it is properly functioning.

The computer 901 receives as input, various testing programs for testing electronic circuits. It executes these test programs to test the electronic circuits over various input and environmental conditions. The test programs communicate with the test station 902 in order to cause different analog voltage levels to be applied to the electronic circuits at various time intervals. The test programs executing on the computer further cause the test station 902 to measure analog voltage levels on outputs of electronic circuits being tested in order to perform a comparison with expected analog voltage levels in order to generate a pass or fail for electronic circuits being tested.

The test station 902 provides the interface for coupling the ATE 900 to an electronic circuit 905 for testing. The test station 902 is connected to the computer 901 in order to receive instructions and the desired digital signals to cause analog voltage levels, representing digital input signals or analog input signals, to be applied to the electronic circuits over the various desired periodic time intervals. The test station 902 also receives the output signals, analog and digital, from electronic circuits being tested in order to convert them into digital form for communication to the computer for comparison with expected analog voltage levels and digital signal outputs.

The test station 902 includes DACs 300A, 300B through 300M for coupling analog or digital voltage levels, through pin driver and load circuits 930A–930M, as inputs into the electronic device being tested. The test station 902 includes a multiplexor 907 and the analog to digital converter ADC 906 for receiving analog output signals from pins of the electronic device being tested. The test station 902 further includes N digital receivers 908A through 908N for receiving digital output signals from the electronic device being tested and comparing the received digital output signals to detect digital logic levels and form digital signals for communication to the computer 901. Each digital receiver, represented by digital receiver 908N, includes DACs 300X and 300Y, and comparators 911 and 912. The output of DACs 300X and 300Y are respectively coupled to terminals of comparators 911 and 912 respectively and the digital output signal line of the electronic device is coupled to both of the other terminals of the comparators 911 and 912. The computer 901 programs the desired voltage levels using DACs 300X and 300Y for which digital logic levels will be recognized. For example, DAC 300X may have its output set to two volts to recognize a high digital logic level on the digital output signal line through comparitor 911 and DAC 300Y may have its output set to 0.8 volts to recognize a low digital logic level on the digital output signal line through comparitor 912.

All DACs within the ATE 900 are DACs 300 of the present invention to substantially eliminate glitch impulses. Primary and secondary glitches are substantially eliminated before being applied to the electronic device under test or used as a comparison reference level and causing testing errors. Whereas in video applications, the overall glitch energy needs to be reduced, it is particularly important in ATE applications to have the amplitude of the glitch impulses reduced in order to avoid damage to the pin drivers and load circuits 930A–930M of the ATE 900 and the electronic device under test. DAC 300 substantially reduces the glitch amplitude in order to be utilized in ATE applications.

The present invention has many advantages over the prior art. One advantage of the present invention is that glitch impulses in digital to analog converters are further reduced. Another advantage of the present invention is that synchronous or asynchronous glitch impulse reduction may be provided in DACs. Still another advantage of the present invention is that glitch cancellation in DACs is improved. One of ordinary skill will see further advantages to the present invention over the prior art after reading through the disclosure.

The preferred embodiments of the present invention for METHOD AND APPARATUS FOR DEGLITCHING DIGITAL TO ANALOG CONVERTERS are thus described. While the present invention has been described in particular embodiments, the present invention should not be construed as limited by such embodiments, but rather construed according to the claims that follow below.

What is claimed is:

1. A digital to analog converter (DAC) to convert a digital input signal into a voltage level of an analog voltage output signal, the DAC comprising:
   a plurality of digital input lines and an analog output line;
   a switched R-2R ladder coupled to the plurality of digital input lines for receiving the digital input signal, the switched R2R ladder generating an intermediate analog voltage signal in response to the digital input signal;

a deglitch circuit coupled to the switched R-2R ladder for receiving the intermediate analog voltage signal and reducing glitch impulses thereon for generation of the analog voltage output signal on the analog output line, the deglitch circuit selectively sampling and holding the intermediate analog voltage signal for generation of the analog output signal on the analog output line substantially without glitch impulses, the selective sampling and holding of the deglitch circuit responsive to a deglitch control signal; and a deglitch controller coupled to the plurality of digital input lines, the deglitch controller generating the deglitch control signal in response to a change in state of the digital input signal on the plurality of digital input lines to control the deglitch circuit.

2. The digital to analog converter (DAC) of claim 1 to convert a digital input signal into a voltage level of an analog voltage output signal, wherein, the deglitch controller is a synchronous deglitch controller for controlling the deglitch circuit in synchronous with a digital input load pulse, the deglitch controller generating the deglitch control signal in synchronous response to the digital input load pulse.

3. The digital to analog converter (DAC) of claim 1 to convert a digital input signal into a voltage level of an analog voltage output signal, wherein, the deglitch controller generates the deglitch control signal causing the deglitch circuit to stop sampling and start holding the intermediate analog voltage signal in response to the digital input load pulse.

4. The digital to analog converter (DAC) of claim 1 to convert a digital input signal into a voltage level of an analog voltage output signal, wherein, the deglitch controller is an asynchronous deglitch controller for controlling the deglitch circuit, the deglitch controller generating the deglitch control signal in response to a change in state of the digital input signal.

5. The digital to analog converter (DAC) of claim 4 to convert a digital input signal into a voltage level of an analog voltage output signal, wherein, the deglitch controller generates the deglitch control signal causing the deglitch circuit to stop sampling and start holding the intermediate analog voltage signal in response to a change in state in the digital input signal.

6. The digital to analog converter (DAC) of claim 4 to convert a digital input signal into a voltage level of an analog voltage output signal, wherein, the deglitch controller does not generate the deglitch control signal allowing the deglitch circuit to continue sampling the intermediate analog voltage signal in response to no change in state in the digital input signal.

7. The digital to analog converter (DAC) of claim 1 to convert a digital input signal into a voltage level of an analog voltage output signal, wherein the deglitch circuit comprises:

a sample and hold circuit coupled to the switched R-2R ladder for selectively sampling and holding the intermediate analog voltage signal after signal settling for generation of the analog output signal without primary glitch impulses in response to the deglitch control signal; and a glitch cancellation circuit coupled to the sample and hold circuit, the glitch cancellation circuit for generating an emulated secondary glitch impulse to cancel a secondary glitch impulse generated by the sample and hold circuit.

8. The digital to analog converter (DAC) of claim 7 to convert a digital input signal into a voltage level of an analog voltage output signal, wherein the sample and hold circuit comprises:

a first analog switch responsive to the deglitch control signal; and a first capacitor coupled to the first analog switch.

9. The digital to analog converter (DAC) of claim 8 to convert a digital input signal into a voltage level of an analog voltage output signal, wherein the first analog switch comprises:

a P channel field effect transistor (PFET) having a source coupled to the switched R-2R ladder, a drain coupled to the first capacitor and a gate coupled to an inverted deglitch control signal; and an N channel field effect transistor (NFET) in parallel with the PFET having a source coupled to the switched R-2R ladder, a drain coupled to the first capacitor and a gate coupled to the deglitch control signal.

10. A digital to analog converter (DAC) to convert a digital input signal into a voltage level of an analog voltage output signal, the DAC comprising:

a plurality of digital input lines and an analog output line;

a switched R-2R ladder coupled to the plurality of digital input lines for receiving the digital input signal, the switched R2R ladder generating an intermediate analog voltage signal in response to the digital input signal;

a deglitch circuit coupled to the switched R-2R ladder for receiving the intermediate analog voltage signal and reducing glitch impulses thereon for generation of the analog voltage output signal on the analog output line, the deglitch circuit selectively sampling and holding the intermediate analog voltage signal for generation of the analog output signal on the analog output line substantially without glitch impulses, the selective sampling and holding of the deglitch circuit responsive to a deglitch control signal;

a deglitch controller coupled to the plurality of digital input lines, the deglitch controller generating the deglitch control signal in response to a change in state of the digital input signal on the plurality of digital input lines to control the deglitch circuit; and the deglitch circuit including a sample and hold circuit coupled to the switched R-2R ladder for selectively sampling and holding the intermediate analog voltage signal after signal settling for generation of the analog output signal without primary glitch impulses in response to the deglitch control signal, and a glitch cancellation circuit coupled to the sample and hold circuit, the glitch cancellation circuit for generating an emulated secondary glitch impulse to cancel a secondary glitch impulse generated by the sample and hold circuit, the glitch cancellation circuit includes an emulation glitch generator for generation of the emulated secondary glitch impulse, and a differential amplifier having a negative input terminal, a positive input terminal, and an output terminal coupled to the analog output line, the differential amplifier having the negative input terminal coupled to the emulation glitch generator for receiving the emulated secondary glitch impulse and having the positive input terminal coupled to the sample and hold circuit, the differential amplifier substantially rejecting the secondary glitch impulse generated by the sample and hold circuit and generating the analog output signal substantially without glitch impulses on the analog output line.

11. The digital to analog converter (DAC) of claim 10 to convert a digital input signal into a voltage level of an analog voltage output signal, wherein the emulation glitch generator for generation of the emulated secondary glitch impulse comprises:

a second analog switch responsive to the deglitch control signal, the second analog switch coupling the emulated secondary glitch impulse to the negative input terminal of the differential amplifier, the second analog switch emulating the first analog switch;

a second capacitor coupled to the negative input terminal, the second capacitor emulating a first half of capacitance of the first capacitor;

a third capacitor coupled across the negative input terminal and the analog output line, the third capacitor emulating a second half of capacitance of the first capacitor; and, a first resistor and a second resistor each coupled to the second analog switch at one end, the second resistor coupled to the output terminal of the differential amplifier at another end, the first resistor and second resistor emulating a resistance of the switched R-2R ladder.

12. The digital to analog converter (DAC) of claim 11 to convert a digital input signal into a voltage level of an analog voltage output signal, wherein, the differential amplifier has a pair of bipolar junction transistors at its negative and positive input terminals, and the first resistor and the second resistor further provide a base current into the negative input terminal substantially matching a base current into the positive input terminal such that the differential amplifier substantially cancels out any effect a base current would have at its output terminal.

13. The digital to analog converter (DAC) of claim 11 to convert a digital input signal into a voltage level of an analog voltage output signal, wherein, the second capacitor, the third capacitor, the first resistor and the second resistor are coupled together in a feedback network such that their frequency response provides for a pole-zero cancellation resulting in zero phase shift in the feedback network.

14. The digital to analog converter (DAC) of claim 11 to convert a digital input signal into a voltage level of an analog voltage output signal, wherein the sample and hold circuit comprises:

a first analog switch responsive to the deglitch control signal; and a first capacitor coupled to the first analog switch.

15. The digital to analog converter (DAC) of claim 14 to convert a digital input signal into a voltage level of an analog voltage output signal, wherein, the glitch cancellation circuit amplifies the intermediate analog voltage signal by a gain of N to extend the range of the analog output signal on the analog output line without switch breakdown, the capacitance of the third capacitor is 1/N times the capacitance of the first capacitor, the capacitance of the second capacitor is [(N−1)/N] times the capacitance of the first capacitor, the resistance of the first resistor is [N/(N−1)] times the resistance of the R-2R ladder, and the resistance of the second resistor is N times the resistance of the R-2R ladder.

16. The digital to analog converter (DAC) of claim 15 to convert a digital input signal into a voltage level of an analog voltage output signal, wherein, the differential amplifier has a pair of bipolar junction transistors at its negative and positive input terminals, and the first resistor and the second resistor further provide a base current into the negative input terminal substantially matching a base current into the positive input terminal such that the differential amplifier substantially cancels out any effect a base current would have at its output terminal.

17. The digital to analog converter (DAC) of claim 15 to convert a digital input signal into a voltage level of an analog voltage output signal, wherein, the second capacitor, the third capacitor, the first resistor and the second resistor are coupled together in a feedback network such that their frequency response provides for a pole-zero cancellation resulting in zero phase shift in the feedback network.

18. The digital to analog converter (DAC) of claim 11 to convert a digital input signal into a voltage level of an analog voltage output signal, wherein the second analog switch comprises:

P channel field effect transistor (PFET) having a source coupled to the first and second resistor, a drain coupled to the second and third capacitor and a gate coupled to an inverted deglitch control signal;

an N channel field effect transistor (NFET) in parallel with the PFET having a source coupled to the first and second resistor, a drain coupled to the second and third capacitor and a gate coupled to the deglitch control signal;

and the second analog switch emulates the resistance of the first analog switch.

19. The digital to analog converter (DAC) of claim 11 to convert a digital input signal into a voltage level of an analog voltage output signal, wherein the analog output line has a load coupled thereto;

the differential amplifier buffers the load from the intermediate output line and provides a gain of two, the buffer receiving the intermediate analog voltage signal and generating the analog voltage output signal substantially similar and responsive to the intermediate analog voltage signal; and the second and third capacitors coupled to the differential amplifier provide continuous negative feedback to stabilize the differential amplifier for driving the load without impacting phase margin.

20. The digital to analog converter (DAC) of claim 10 to convert a digital input signal into a voltage level of an analog voltage output signal, wherein the emulation glitch generator for generation of the emulated secondary glitch impulse comprises:

a second analog switch responsive to the deglitch control signal, the second analog switch coupling the emulated secondary glitch impulse to the negative input terminal of the differential amplifier, the second analog switch emulating the first analog switch;

a second capacitor coupled across the negative input terminal and the analog output line, the second capacitor emulating the capacitance of the first capacitor; and, a first resistor coupled to the second analog switch at one end and the analog output line at another end, the first resistor emulating a resistance of the switched R-2R ladder.

21. The digital to analog converter (DAC) of claim 20 to convert a digital input signal into a voltage level of an analog voltage output signal, wherein the second analog switch comprises:
- P channel field effect transistor (PFET) having a source coupled to the first and second resistor, a drain coupled to the second capacitor and a gate coupled to an inverted deglitch control signal;
- an N channel field effect transistor (NFET) in parallel with the PFET having a source coupled to the first and second resistor, a drain coupled to the second capacitor and a gate coupled to the deglitch control signal; and,
- the second analog switch emulates the resistance of the first analog switch.

22. The digital to analog converter (DAC) of claim 20 to convert a digital input signal into a voltage level of an analog voltage output signal, wherein
- the analog output line has a load coupled thereto;
- the differential amplifier buffers the load from the intermediate output line and provides a gain of one, the buffer receiving the intermediate analog voltage signal and generating the analog voltage output signal substantially similar and responsive to the intermediate analog voltage signal; and
- the second capacitor coupled to the differential amplifier to provide continuous negative feedback to stabilize the differential amplifier for driving the load without impacting phase margin.

23. A digital to analog converter (DAC) to convert a digital input signal into a voltage level of an analog voltage output signal, the DAC comprising:
- a plurality of digital input lines and an analog output line;
- a switched R-2R ladder coupled to the plurality of digital input lines for receiving the digital input signal, the switched R2R ladder generating an intermediate analog voltage signal in response to the digital input signal;
- a deglitch circuit coupled to the switched R-2R ladder for receiving the intermediate analog voltage signal and reducing glitch impulses thereon for generation of the analog voltage output signal on the analog output line, the deglitch circuit selectively sampling and holding the intermediate analog voltage signal for generation of the analog output signal on the analog output line substantially without glitch impulses, the selective sampling and holding of the deglitch circuit responsive to a deglitch control signal; and
- a synchronous deglitch controller coupled to the plurality of digital input lines, the synchronous deglitch controller generating the deglitch control signal responsive to a change in state of the digital input signal on the plurality of digital input lines and synchronously responsive to a digital input load pulse,
- the deglitch controller includes
    - a latch for latching the digital input signal in response to the digital input load pulse,
    - a one shot pulse generator for generating a one shot pulse responsive to the digital input load pulse, and
    - an inverter for inverting the one shot pulse,
    - such that the deglitch control signal is generated responsive to the one shot pulse causing the deglitch circuit to stop sampling and start holding the intermediate analog voltage signal.

24. The digital to analog converter (DAC) of claim 23 to convert a digital input signal into a voltage level of an analog voltage output signal, wherein the deglitch controller further comprises,
- a level shifter for receiving the one shot pulse and level shifting the logic levels of the one shot pulse into logic levels having a positive generated voltage and a negative generated voltage for formation of the deglitch control signal,
- a voltage generator for receiving a range of power supply voltages, the voltage generator generating the positive generated voltage greater than a positive analog reference voltage and the negative generated voltage less than a negative analog reference voltage, the voltage range between the positive generated voltage and the negative generated voltage is less than a switch breakdown voltage.

25. A digital to analog converter (DAC) to convert a digital input signal into a voltage level of an analog voltage output signal, the DAC comprises:
- a plurality of digital input lines and an analog output line;
- a switched R-2R ladder coupled to the plurality of digital input lines for receiving the digital input signal, the switched R2R ladder generating an intermediate analog voltage signal in response to the digital input signal;
- a deglitch circuit coupled to the switched R-2R ladder for receiving the intermediate analog voltage signal and reducing glitch impulses thereon for generation of the analog voltage output signal on the analog output line, the deglitch circuit selectively sampling and holding the intermediate analog voltage signal for generation of the analog output signal on the analog output line substantially without glitch impulses, the selective sampling and holding of the deglitch circuit responsive to a deglitch control signal; and
- an asynchronous deglitch controller to control the deglitch circuit, the asynchronous deglitch controller coupled to the plurality of digital input lines to generate the deglitch control signal in response to a change in state of the digital input signal, the asynchronous deglitch controller includes
    - a delay element for preserving a prior state of the digital input signal,
    - an exclusive-OR gate coupled to the delay element and a digital input line, the exclusive-OR gate for receiving and comparing a new state of the digital input signal and the prior state of the digital input signal to determine a change in state or no change in state of the digital input signal, and,
    - a one shot pulse generator coupled to the exclusive-OR gate for generating the deglitch control signal to stop sampling and start holding the intermediate analog voltage signal in response to the exclusive-OR gate determining a change in state in the digital input signal.

26. The digital to analog converter (DAC) of claim 25 to convert a digital input signal into a voltage level of an analog voltage output signal, wherein the deglitch circuit comprises:
- a sample and hold circuit coupled to the switched R-2R ladder for selectively sampling and holding the intermediate analog voltage signal after signal settling for generation of the analog output signal without primary glitch impulses in response to the deglitch control signal; and
- a glitch cancellation circuit coupled to the sample and hold circuit, the glitch cancellation circuit for generating an emulated secondary glitch impulse to cancel a secondary glitch impulse generated by the sample and hold circuit.

27. The digital to analog converter (DAC) of claim 26 to convert a digital input signal into a voltage level of an analog voltage output signal, wherein the sample and hold circuit comprises:
- a first analog switch responsive to the deglitch control signal; and
- a first capacitor coupled to the first analog switch.

28. The digital to analog converter (DAC) of claim 27 to convert a digital input signal into a voltage level of an analog voltage output signal, wherein the first analog switch comprises:
- a P channel field effect transistor (PFET) having a source coupled to the switched R-2R ladder, a drain coupled to the first capacitor and a gate coupled to an inverted deglitch control signal; and
- an N channel field effect transistor (NFET) in parallel with the PFET having a source coupled to the switched R-2R ladder, a drain coupled to the first capacitor and a gate coupled to the deglitch control signal.

29. The digital to analog converter (DAC) of claim 26 to convert a digital input signal into a voltage level of an analog voltage output signal, wherein the glitch cancellation circuit includes
- an emulation glitch generator for generation of the emulated secondary glitch impulse, and
- a differential amplifier having a negative input terminal, a positive input terminal, and an output terminal coupled to the analog output line, the differential amplifier having the negative input terminal coupled to the emulation glitch generator for receiving the emulated secondary glitch impulse and having the positive input terminal coupled to the sample and hold circuit, the differential amplifier substantially rejecting the secondary glitch impulse generated by the sample and hold circuit and generating the analog output signal substantially without glitch impulses on the analog output line.

30. The digital to analog converter (DAC) of claim 29 to convert a digital input signal into a voltage level of an analog voltage output signal, wherein the emulation glitch generator for generation of the emulated secondary glitch impulse comprises:
- a second analog switch responsive to the deglitch control signal, the second analog switch coupling the emulated secondary glitch impulse to the negative input terminal of the differential amplifier, the second analog switch emulating the first analog switch;
- a second capacitor coupled to the negative input terminal, the second capacitor emulating a first half of capacitance of the first capacitor;
- a third capacitor coupled across the negative input terminal and the analog output line, the third capacitor emulating a second half of capacitance of the first capacitor; and,
- a first resistor and a second resistor each coupled to the second analog switch at one end, the second resistor coupled to the output terminal of the differential amplifier at another end, the first resistor and second resistor emulating a resistance of the switched R-2R ladder.

31. The digital to analog converter (DAC) of claim 30 to convert a digital input signal into a voltage level of an analog voltage output signal, wherein,
the differential amplifier has a pair of bipolar junction transistors at its negative and positive input terminals, and
the first resistor and the second resistor further provide a base current into the negative input terminal substantially matching a base current into the positive input terminal such that the differential amplifier substantially cancels out any effect a base current would have at its output terminal.

32. A method of converting a digital signal into an analog signal output substantially without glitch impulses, comprising:
- a) providing a switched R-2R ladder generating an analog signal responsive to the digital signal;
- b) sampling the analog signal prior to a change in state of the digital signal;
- c) detecting for a change in state of the digital signal;
- d) stopping the sampling of the analog signal upon detecting a change in state of the digital signal and holding the analog level of the analog signal to avoid sampling primary glitch impulses; and
- e) after a predetermined time, resampling the analog signal.

33. The method of claim 32 of converting a digital signal into an analog signal substantially without glitch impulses wherein,
the predetermined time is sufficient to allow the analog signal to settle to a stable analog level before resampling the analog signal.

34. The method of claim 32 of converting a digital signal into an analog signal substantially without glitch impulses, the method further comprising:
- f) selectively generating an emulated secondary glitch to emulate when a secondary glitch impulse is imposed on the analog signal generating secondary glitch impulses through sampling, stopping the sampling, and resampling the analog signal; and
- g) substantially canceling the secondary glitch impulse when it is imposed on the analog signal by subtracting the selectively generated emulated secondary glitch from the analog signal and generating the analog signal output responsive to the analog signal less the selectively generated emulated secondary glitch, the analog signal output substantially without glitch impulses.

35. The method of claim 34 of converting a digital signal into an analog signal substantially without glitch impulses wherein,
the predetermined time is sufficient to allow the analog signal to settle to a stable analog level before resampling the analog signal.

36. An automated tester for testing electronic circuits, the tester comprising:
- a computer for receiving and executing test programs for testing electronic circuits, the test programs causing analog voltage levels to be applied to the electronic circuits over a plurality of periodic intervals, test programs further causing analog voltage levels provided on outputs from the electronic circuits to be compared with expected data to generate a pass or fail for electronic circuits being tested; and,
- a test station for coupling to an electronic circuit for testing, the test station coupled to the computer for receiving instructions and input digital signals to cause analog voltage levels to be applied to the electronic circuits over the plurality of periodic intervals and for causing analog voltage levels provided on outputs of the electronic circuits to be converted into digital form for communication to the computer for comparison with expected data, the test station comprising,
    a plurality of digital to analog converters for generation of analog voltage levels for coupling to inputs of the electronic circuits over the plurality of periodic intervals, each digital to analog converter of the test station comprising,
- a switched R-2R ladder for generating an intermediate analog voltage signal in response to the input digital signals;
- a deglitch circuit coupled to the switched R-2R ladder for receiving the intermediate analog voltage signal and reducing glitch impulses thereon for generation of the analog levels, the deglitch circuit selectively sampling and holding the intermediate analog voltage signal for generation of the analog voltage levels to be applied to the electronic circuits, the analog voltage levels substantially without glitch impulses, the selective sampling and holding of the deglitch circuit responsive to a deglitch control signal; and
- a deglitch controller for generating the deglitch control signal in response to a change in state of the input digital signals to control the deglitch circuit.

37. The automated tester of claim 36 for testing electronic circuits, the test station further comprising:
- an analog to digital converter for converting the analog voltage levels, on outputs of electronic circuits being tested, into digital form for communication to the computer for comparison with expected analog voltage levels.

38. The automated tester of claim 36 for testing electronic circuits, the test station further comprising:
- a plurality of digital receivers for receiving digital output signals on digital outputs from the electronic circuits being tested and for comparing the digital output signals with expected voltage levels for high and low digital logic levels to generate tested digital output values and for communication to the computer for comparison with expected digital output values.

39. The automated tester of claim 38 for testing electronic circuits, wherein each digital receiver comprises:
- a first digital to analog converter and a second digital to analog converter each having an output respectively coupled to a comparison input of first and second comparitors, the first and second comparitors each having another comparison input for coupling to a digital output of electronic devices being tested, the first comparitor comparing the voltage level on the digital output with the output voltage of the first digital to analog converter, and the second comparitor comparing the voltage level on the digital output with the output voltage of the second digital to analog converter.

40. The automated tester of claim 36 for testing electronic circuits, wherein the deglitch circuit of the digital to analog converter comprises:
- a sample and hold circuit coupled to the switched R-2R ladder for selectively sampling and holding the intermediate analog voltage signal after signal settling for generation of the analog voltage levels in response to the deglitch control signal; and
- a glitch cancellation circuit coupled to the sample and hold circuit, the glitch cancellation circuit for generating an emulated secondary glitch impulse to cancel a secondary glitch impulse generated by the sample and hold circuit.

41. The automated tester of claim 40 for testing electronic circuits, wherein the sample and hold circuit of the digital to analog converter comprises:
- a first analog switch responsive to the deglitch control signal; and
- a first capacitor coupled to the first analog switch.

42. The automated tester of claim 41 for testing electronic circuits, wherein the first analog switch of the sample and hold circuit of the digital to analog converter comprises:
- a P channel field effect transistor (PFET) having a source coupled to the switched R-2R ladder, a drain coupled to the first capacitor and a gate coupled to an inverted deglitch control signal; and
- an N channel field effect transistor (NFET) in parallel with the PFET having a source coupled to the switched R-2R ladder, a drain coupled to the first capacitor and a gate coupled to the deglitch control signal.

43. The automated tester of claim 36 for testing electronic circuits, wherein,
- the deglitch controller is a synchronous deglitch controller for controlling the deglitch circuit in synchronous with a digital input load pulse, the deglitch controller generating the deglitch control signal in synchronous response to the digital input load pulse.

44. The automated tester of claim 43 for testing electronic circuits, wherein,
- the deglitch controller generates the deglitch control signal causing the deglitch circuit to stop sampling and start holding the intermediate analog voltage signal in response to a change in state in the input digital signals.

45. The automated tester of claim 36 for testing electronic circuits, wherein,
- the deglitch controller is an asynchronous deglitch controller for controlling the deglitch circuit, the deglitch controller generating the deglitch control signal in response to a change in state of the input digital signals.

46. The automated tester of claim 45 for testing electronic circuits, wherein,
- the deglitch controller generates the deglitch control signal causing the deglitch circuit to stop sampling and start holding the intermediate analog voltage signal in response to a change in state in the input digital signals.

47. The automated tester of claim 45 for testing electronic circuits, wherein,
- the deglitch controller does not generate the deglitch control signal allowing the deglitch circuit to continue sampling the intermediate analog voltage signal in response to no change in state in the input digital signals.

48. The automated tester of claim 45 for testing electronic circuits, wherein the deglitch controller of the digital to analog converter comprises,
- a delay element for preserving a prior state of the input digital signals;
- an exclusive-OR gate coupled to the delay element and a digital input line, the exclusive-OR gate for receiving and comparing a new state of the input digital signals and the prior state of the input digital signals to determine a change in state or no change in state of the input digital signals; and,
- a one shot pulse generator coupled to the exclusive-OR gate for generating the deglitch control signal to stop sampling and start holding the intermediate analog voltage signal in response to the exclusive-OR gate determining a change in state in the input digital signals.

49. An automated tester for testing electronic circuits, the tester comprising:
a computer for receiving and executing test programs for testing electronic circuits, the test programs causing analog voltage levels to be applied to the electronic circuits over a plurality of periodic intervals, test programs further causing analog voltage levels provided on outputs from the electronic circuits to be compared with expected data to generate a pass or fail for electronic circuits being tested; and, a test station to coupling to an electronic circuit for testing, the test station coupled to the computer to receive instructions and input digital signals to cause analog voltage levels to be applied to the electronic circuits over the plurality of periodic intervals and to cause analog voltage levels provided on outputs of the electronic circuits to be converted into digital form for communication to the computer for comparison with expected data, the test station comprising, a plurality of digital to analog converters to generate analog voltage levels for coupling to inputs of the electronic circuits over the plurality of periodic intervals, each digital to analog converter of the test station including, a switched R-2R ladder to generate an intermediate analog voltage signal in response to the input digital signals, a deglitch circuit coupled to the switched R-2R ladder to receive the intermediate analog voltage signal and to reduce glitch impulses thereon for generation of the analog levels, the deglitch circuit to selectively sample and hold the intermediate analog voltage signal to generate the analog voltage levels to be applied to the electronic circuits, the analog voltage levels substantially without glitch impulses, the selective sampling and holding of the deglitch circuit responsive to a deglitch control signal, the deglitch circuit including a sample and hold circuit coupled to the switched R-2R ladder to selectively sample and hold the intermediate analog voltage signal after signal settling to generate the analog voltage levels in response to the deglitch control signal, a glitch cancellation circuit coupled to the sample and hold circuit, the glitch cancellation circuit to generate an emulated secondary glitch impulse to cancel a secondary glitch impulse generated by the sample and hold circuit, the glitch cancellation circuit includes an emulation glitch generator to generate the emulated secondary glitch impulse, and a differential amplifier having a negative input terminal, a positive input terminal, and an output terminal, the differential amplifier having the negative input terminal coupled to the emulation glitch generator to receive the emulated secondary glitch impulse and having the positive input terminal coupled to the sample and hold circuit, the differential amplifier to reject the secondary glitch impulse generated by the sample and hold circuit and to generate the analog voltage levels substantially without glitch impulses, and a deglitch controller to generate the deglitch control signal in response to a change in state of the input digital signals to control the deglitch circuit.

50. The automated tester of claim 49 for testing electronic circuits, wherein the emulation glitch generator of the digital to analog converter for generation of the emulated secondary glitch impulse comprises:

a second analog switch responsive to the deglitch control signal, the second analog switch coupling the emulated secondary glitch impulse to the negative input terminal of the differential amplifier, the second analog switch emulating the first analog switch;

a second capacitor coupled to the negative input terminal, the second capacitor emulating a first half of capacitance of the first capacitor;

a third capacitor coupled across the negative input terminal and the output terminal, the third capacitor emulating a second half of capacitance of the first capacitor; and, a first resistor and a second resistor each coupled to the second analog switch at one end, the second resistor coupled to the output terminal of the differential amplifier at another end, the first resistor and second resistor emulating a resistance of the switched R-2R ladder.

51. The automated tester of claim 50 for testing electronic circuits, wherein the second analog switch of the digital to analog converter comprises:

P channel field effect transistor (PFET) having a source coupled to the first and second resistor, a drain coupled to the second and third capacitor and a gate coupled to an inverted deglitch control signal;

an N channel field effect transistor (NFET) in parallel with the PFET having a source coupled to the first and second resistor, a drain coupled to the second and third capacitor and a gate coupled to the deglitch control signal;

and the second analog switch emulates the resistance of the first analog switch.

52. The automated tester of claim 49 for testing electronic circuits, wherein, the differential amplifier of the glitch cancellation circuit of the digital to analog converter has a pair of bipolar junction transistors at its negative and positive input terminals, and the first resistor and the second resistor of the emulated glitch generator further provide a base current into the negative input terminal substantially matching a base current into the positive input terminal such that the differential amplifier substantially cancels out any effect a base current would have at its output terminal.

53. The automated tester of claim 49 for testing electronic circuits, wherein, the second capacitor, the third capacitor, the first resistor and the second resistor are coupled together in a feedback network such that their frequency response provides for a pole-zero cancellation resulting in zero phase shift in the feedback network.

54. The automated tester of claim 49 for testing electronic circuits, wherein the sample and hold circuit comprises:

a first analog switch responsive to the deglitch control signal; and a first capacitor coupled to the first analog switch.

55. The automated tester of claim 49 for testing electronic circuits, wherein, the glitch cancellation circuit amplifies the intermediate analog voltage signal by a gain of N to extend the range of the analog output signal on the analog output line without switch breakdown, the capacitance of the third capacitor is $1/N$ times the capacitance of the first capacitor, the capacitance of the second capacitor is $[(N-1)/N]$ times the capacitance of the first capacitor, the resistance of the first resistor is $[N/(N-1)]$ times the resistance of the R-2R ladder, and the resistance of the second resistor is N times the resistance of the R-2R ladder.

56. The automated tester of claim 55 for testing electronic circuits, wherein, the differential amplifier has a pair of bipolar junction transistors at its negative and positive input terminals, and the first resistor and the second resistor further provide a base current into the negative input terminal substantially matching a base current into the positive input terminal such that the differential amplifier substantially cancels out any effect a base current would have at its output terminal.

57. The automated tester of claim 55 for testing electronic circuits, wherein, the second capacitor, the third capacitor, the first resistor and the second resistor are coupled together in a feedback network such that their frequency response provides for a pole-zero cancellation resulting in zero phase shift in the feedback network.

58. The automated tester of claim 49 for testing electronic circuits, wherein the emulation glitch generator for generation of the emulated secondary glitch impulse comprises:

a second analog switch responsive to the deglitch control signal, the second analog switch coupling the emulated secondary glitch impulse to the negative input terminal of the differential amplifier, the second analog switch emulating the first analog switch;

a second capacitor coupled across the negative input terminal and the output terminal, the second capacitor emulating the capacitance of the first capacitor; and, a first resistor coupled to the second analog switch at one end and the output terminal at another end, the first resistor emulating a resistance of the switched R-2R ladder.

59. The automated tester of claim 58 for testing electronic circuits, wherein the second analog switch comprises:

P channel field effect transistor (PFET) having a source coupled to the first and second resistor, a drain coupled to the second capacitor and a gate coupled to an inverted deglitch control signal;

an N channel field effect transistor (NFET) in parallel with the PFET having a source coupled to the first and second resistor, a drain coupled to the second capacitor and a gate coupled to the deglitch control signal; and, the second analog switch emulates the resistance of the first analog switch.

60. An automated tester for testing electronic circuits, the tester comprising:

a computer for receiving and executing test programs for testing electronic circuits, the test programs causing analog voltage levels to be applied to the electronic circuits over a plurality of periodic intervals, test programs further causing analog voltage levels provided on outputs from the electronic circuits to be compared with expected data to generate a pass or fail for electronic circuits being tested; and, a test station to coupling to an electronic circuit for testing, the test station coupled to the computer to receive instructions and input digital signals to cause analog voltage levels to be applied to the electronic circuits over the plurality of periodic intervals and to cause analog voltage levels provided on outputs of the electronic circuits to be converted into digital form for communication to the computer for comparison with expected data, the test station comprising, a plurality of digital to analog converters to generate analog voltage levels for coupling to inputs of the electronic circuits over the plurality of periodic intervals, each digital to analog converter of the test station including, a switched R-2R ladder to generate an intermediate analog voltage signal in response to the input digital signals, a deglitch circuit coupled to the switched R-2R ladder to receive the intermediate analog voltage signal and to reduce glitch impulses thereon for generation of the analog levels, the deglitch circuit to selectively sample and hold the intermediate analog voltage signal to generate the analog voltage levels to be applied to the electronic circuits, the analog voltage levels substantially without glitch impulses, the selective sampling and holding of the deglitch circuit responsive to a deglitch control signal, and a synchronous deglitch controller to control the deglitch circuit in synchronous with a digital input load pulse, the synchronous deglitch controller to generate the deglitch control signal in response to a change in state of the input digital signals and in synchronous response to the digital input load pulse, the synchronous deglitch controller includes a latch to latch a prior state of the input digital signals, a one shot pulse generator to generate a one shot pulse responsive to the digital input load pulse, and an inverter to invert the one shot pulse, whereby the deglitch control signal is generated responsive to the one shot pulse causing the deglitch circuit to stop sampling and start holding the intermediate analog voltage signal.

61. The automated tester of claim 60 for testing electronic circuits, wherein the deglitch controller further comprises, a level shifter for receiving the one shot pulse and level shifting the logic levels of the one shot pulse into logic levels having a positive generated voltage and a negative generated voltage for formation of the deglitch control signal, a voltage generator for receiving a range of power supply voltages, the voltage generator generating the positive generated voltage greater than a positive analog reference voltage and the negative generated voltage less than a negative analog reference voltage, the voltage range between the positive generated voltage and the negative generated voltage is less than a switch breakdown voltage.

62. A deglitch circuit for a digital to analog converter (DAC), the deglitch circuit comprising:

a sample and hold circuit coupled to an analog output of a DAC, the sample and hold circuit to selectively sample and hold an analog voltage signal from the analog output after signal settling to generate an analog output signal without primary glitch impulses, the selective sampling and holding of the sample and hold circuit responsive to a change in state of a digital input signal coupled into the DAC for conversion to an analog signal; and a glitch cancellation circuit coupled to the sample and hold circuit, the glitch cancellation circuit to generate an emulated secondary glitch impulse to cancel a secondary glitch impulse generated by the sample and hold circuit.

63. The deglitch circuit of claim 62 further comprising:

a deglitch controller coupled to a plurality of digital input lines of the digital input signal of the DAC, the deglitch controller generating a deglitch control signal responsive to a change in state of the digital input signal on the plurality of digital input lines, the deglitch control signal to control the selective sampling and holding of the sample and hold circuit.

64. The deglitch circuit of claim 63 wherein the sample and hold circuit includes:

a first analog switch responsive to the deglitch control signal; and a first capacitor coupled to the first analog switch.

65. The deglitch circuit of claim 62 wherein the glitch cancellation circuit includes:

an emulation glitch generator to generate the emulated secondary glitch impulse, and a differential amplifier having a negative input terminal, a positive input terminal, and an output terminal, the differential amplifier having the negative input terminal coupled to the emulation glitch generator to receive the emulated secondary glitch impulse and having the positive input terminal coupled to the sample and hold circuit, the differential amplifier to reject the secondary glitch impulse generated by the sample and hold circuit and to generate the analog voltage levels substantially without glitch impulses.

66. A deglitch circuit for a digital to analog converter (DAC), the deglitch circuit comprising:

a sample and hold circuit coupled to an analog output of a DAC, the sample and hold circuit to selectively sample and hold an analog voltage signal from the analog output after signal settling to generate an analog output signal without primary glitch impulses, the selective sampling and holding of the sample and hold circuit responsive to a change in state of a digital input signal coupled into the DAC for conversion to an analog signal, the sample and hold circuit generating a secondary glitch impulse in the selective sampling and holding;

an emulation glitch generator to generate an emulated secondary glitch impulse; and a differential amplifier having a negative input terminal, a positive input terminal, and an output terminal, the differential amplifier having the negative input terminal coupled to the emulation glitch generator to receive the emulated secondary glitch impulse and having the positive input terminal coupled to the sample and hold circuit, the differential amplifier to reject the secondary glitch impulse generated by the sample and hold circuit and to generate the analog output signal substantially without glitch impulses.

67. The deglitch circuit of claim 66 further comprising:

a deglitch controller coupled to a plurality of digital input lines of the digital input signal of the DAC, the deglitch controller generating a deglitch control signal responsive to a change in state of the digital input signal on the plurality of digital input lines, the deglitch control signal to control the selective sampling and holding of the sample and hold circuit.

68. The deglitch circuit of claim 67 wherein the sample and hold circuit includes:

a first analog switch responsive to the deglitch control signal; and a first capacitor coupled to the first analog switch.

69. A deglitch circuit for a digital to analog converter (DAC), the deglitch circuit comprising:

a sample and hold circuit coupled to an intermediate analog output of a DAC, the sample and hold circuit to selectively sample and hold an analog voltage signal from the intermediate analog output after signal settling to generate an analog output signal without primary glitch impulses, the selective sampling and holding of the sample and hold circuit responsive to a deglitch control signal, the sample and hold circuit to generate a secondary glitch impulse in response to a change in state of the deglitch control signal;

a first analog switch to generate an emulated secondary glitch impulse in response to the change in state of the deglitch control signal, the first analog switch having a first terminal, a second terminal and at least one control terminal, the at least one control terminal coupled to the deglitch control signal;

a differential amplifier having a negative input terminal, a positive input terminal, and an output terminal, the differential amplifier having the negative input terminal coupled to the second terminal of the first analog switch and the positive input terminal coupled to the sample and hold circuit;

a first resistor having one end coupled to the output terminal of the differential amplifier and another end coupled to the first terminal of the first analog switch;

a second resistor having one end coupled to the first terminal of the first analog switch and the another end of the first resistor and the second resistor having another end coupled to ground;

a first capacitor having one end coupled to the output terminal of the differential amplifier and another end coupled to the negative input terminal of the differential amplifier and the second terminal of the first analog switch; and a second capacitor having one end coupled to the negative input terminal of the differential amplifier and the second terminal of the first analog switch and another end coupled to ground.

70. The deglitch circuit of claim 69 further comprising:

a deglitch controller coupled to a plurality of digital input lines of the digital input signal of the DAC, the deglitch controller to generate the deglitch control signal responsive to the change in state of the digital input signal on the plurality of digital input lines, the deglitch control signal to control the selective sampling and holding of the sample and hold circuit.

71. The deglitch circuit of claim 69 wherein the sample and hold circuit includes:

a second analog switch having a first terminal to couple to the intermediate analog output of the DAC, a second terminal coupled to the positive input terminal of the differential amplifier and a control terminal coupled to the deglitch control signal and being responsive thereto;

a third capacitor having one end coupled to the second terminal of the second analog switch and the positive input terminal of the differential amplifier and another end coupled to ground; and wherein an equivalent resistance of the first and second resistors and an equivalent capacitance of the first and second capacitors provide similar impedance on the first and second terminals of the first analog switch in comparison with an impedance on the first and second terminals of the second analog switch, the similar impedance providing similar charge cancellation on the positive input terminal and negative input terminal of the differential amplifier.

72. The deglitch circuit of claim 71 wherein,
the first analog switch and the second analog switch provide similar impedance respectively on the negative input terminal and the positive input terminal of the differential amplifier to cancel out secondary glitch impulses and to provide base current cancellation.

73. The deglitch circuit of claim 69 wherein,
the differential amplifier receives the emulated secondary glitch impulse on its negative input terminal and the secondary glitch impulse generated by the sample and hold circuit on its positive input terminal and generates the analog output signal substantially without secondary glitch impulses at its output terminal.

74. The deglitch circuit of claim 69 wherein,
a resistance of the first resistor is N times a unit resistance,
a resistance of the second resistor is $$\frac{N}{(N-1)}$$

times the unit resistance,
a capacitance of the first capacitor is $$\frac{1}{N}$$

times a unit capacitance,
a capacitance of the second capacitor is $$\frac{(N-1)}{N}$$

times the unit capacitance, and
N is a variable number chosen to scale the gain provided by the deglitch circuit to achieve a desired output voltage range of the analog output signal for a given voltage range generated by the DAC on the intermediate analog output.

75. The deglitch circuit of claim 69 wherein,
the first resistor, the second resistor, the first capacitor, and the second capacitor form a feedback network around the differential amplifier to provide pole-zero cancellation which maintains the stability of the output of the differential amplifier and eliminates additional phase shift.

76. The deglitch circuit of claim 69 wherein,
the first capacitor and the second capacitor maintain a negative feedback around the differential amplifier when the first analog switch, responsive to the deglitch control signal, is open in a hold mode.

77. The deglitch circuit of claim 69 wherein,
the first resistor, the second resistor, the first capacitor, and the second capacitor form a feedback network around the differential amplifier to provide gain when the first analog switch, responsive to the deglitch control signal, is closed in a sample mode.

78. The deglitch circuit of claim 69 wherein,
the resistances of the first resistor and the second resistor are chosen so that their equivalent resistance matches the output resistance of the DAC to provide base current cancellation and reduce/eliminate an input referred voltage offset of the differential amplifier.

79. A deglitch circuit for a digital to analog converter (DAC), the deglitch circuit comprising:
a sample and holding means coupled to an analog output of a DAC, the sample and hold means to selectively sample and hold an analog voltage signal from the analog output after signal settling to generate an analog output signal without primary glitch impulses, the selective sampling and holding of the sample and holding means responsive to a change in state of a digital input signal coupled into the DAC for conversion to an analog signal; and
a glitch cancellation means coupled to the sample and holding means, the glitch cancellation means to generate an emulated secondary glitch impulse to cancel a secondary glitch impulse generated by the sample and holding means.

80. The deglitch circuit of claim 79 further comprising:
a deglitch control means coupled to a plurality of digital input lines of the digital input signal of the DAC, the deglitch control means generating a deglitch control signal responsive to a change in state of the digital input signal on the plurality of digital input lines, the deglitch control signal to control the selective sampling and holding of the sample and holding means.

81. The deglitch circuit of claim 80 wherein the sample and holding means includes:
a first analog switching means responsive to the deglitch control signal; and
a first charge storing means coupled to the first analog switching means.

82. The deglitch circuit of claim 79 wherein the glitch cancellation means includes:
an emulation glitch generating means to generate the emulated secondary glitch impulse, and
a differential amplifying means having a negative input terminal, a positive input terminal, and an output terminal, the differential amplifying means having the negative input terminal coupled to the emulation glitch generating means to receive the emulated secondary glitch impulse and having the positive input terminal coupled to the sample and holding means, the differential amplifying means to reject the secondary glitch impulse generated by the sample and holding means and to generate the analog voltage levels substantially without glitch impulses.

83. A digital to analog converter (DAC), comprising:
a switching means to generate an intermediate analog signal responsive to a digital input signal;
a sample and hold means to sample the intermediate analog signal prior to a change in state in the digital input signal and to stop sampling of the intermediate analog signal and hold the analog level of the intermediate analog signal to avoid sampling primary glitch impulses in response to a deglitch signal; and
a detecting means to detect a change in the digital input signal and generate the deglitch signal in response thereto.

84. The digital to analog converter (DAC) of claim 83, further comprising:
a generating means to selectively generate an emulated secondary glitch of a secondary glitch impulse imposed on the intermediate analog signal; and a canceling means to cancel the secondary glitch impulse when it is imposed on the intermediate analog signal by differentially removing the selectively generated emulated secondary glitch from the intermediate analog signal and to generate an analog output signal of the digital to analog converter responsive to the intermediate analog signal less the selectively generated emulated secondary glitch.

85. The digital to analog converter (DAC) of claim 84, wherein, the canceling means includes a differential amplifier to differentially remove the selectively generated emulated secondary glitch from the intermediate analog signal.

86. A digital to analog converter (DAC) to convert a digital input signal into a voltage level of an analog voltage output signal, the DAC comprising:

a digital input terminal and an analog output terminal;

a switching means coupled to the digital input terminal to receive the digital input signal, the switching means to generate an intermediate analog voltage signal in response to the digital input signal;

a deglitching means coupled to the switching means to receive the intermediate analog voltage signal and to reduce glitch impulses thereon, the deglitching means selectively sampling and holding the intermediate analog voltage signal to generate a sampled intermediate analog voltage signal, the selective sampling and holding of the deglitching means responsive to a deglitch control signal; and a controlling means coupled to the digital input terminal, the controlling means to generate the deglitch control signal in response to a change in the digital input signal at the digital input terminal.

87. The digital to analog converter (DAC) of claim 86, wherein the deglitching means includes a sample and holding means coupled to the switching means to selectively sample and hold the intermediate analog voltage signal in response to the deglitch control signal to form the sampled intermediate analog voltage signal; and a glitch canceling means coupled to the sample and holding means, the glitch canceling mean to generate an emulated secondary glitch impulse and cancel a secondary glitch impulse generated by the sample and holding means.

88. The digital to analog converter (DAC) of claim 87, wherein the sample and holding means includes a first analog switching means responsive to the deglitch control signal; and a first charge storing means coupled to the first analog switching means.

89. The digital to analog converter (DAC) of claim 87, wherein the glitch canceling means includes a generating means to generate the emulated secondary glitch impulse, and a differential amplifier coupled to the generating means to receive the emulated secondary glitch impulse and coupled to the sample and holding means to receive the sampled intermediate analog voltage signal, the differential amplifier to reject the secondary glitch impulse generated by the sample and holding means and generate the analog output signal substantially without glitch impulses at the analog output of the digital to analog converter.

90. The digital to analog converter (DAC) of claim 86, wherein, the controlling means is a synchronous controlling means to control the deglitching means in synchronous with a digital input load pulse.

91. The digital to analog converter (DAC) of claim 90, wherein, the controlling means generates the deglitch control signal causing the deglitching means to stop sampling and start holding the intermediate analog voltage signal in response to the digital input load pulse and a change in the digital input signal.

92. The digital to analog converter (DAC) of claim 90, wherein, the controlling means does not generate the deglitch control signal allowing the deglitching means to continue sampling the intermediate analog voltage signal in response to no change in the digital input signal.

93. The digital to analog converter (DAC) of claim 86, wherein, the controlling means is an asynchronous controlling means to control the deglitching means, the controlling means to generate the deglitch control signal in response to a change in the digital input signal.

94. The digital to analog converter (DAC) of claim 93, wherein, the controlling means generates the deglitch control signal causing the deglitching means to stop sampling and start holding the intermediate analog voltage signal in response to a change in the digital input signal.

95. The digital to analog converter (DAC) of claim 93, wherein, the controlling means does not generate the deglitch control signal allowing the deglitching means to continue sampling the intermediate analog voltage signal in response to no change in the digital input signal.

\* \* \* \* \*

UNITED STATES PATENT AND TRADEMARK OFFICE
CERTIFICATE OF CORRECTION

PATENT NO.         : 6,304,199 B1
APPLICATION NO. : 09/305909
DATED                : October 16, 2001
INVENTOR(S)       : Fang et al.

It is certified that error appears in the above-identified patent and that said Letters Patent is hereby corrected as shown below:

In Claim #3, Line 1, please delete "claim 1" and insert -- claim 2 --.

Signed and Sealed this

Twenty-second Day of May, 2007

JON W. DUDAS
*Director of the United States Patent and Trademark Office*